US008139780B2

(12) United States Patent
Shearer

(10) Patent No.: US 8,139,780 B2
(45) Date of Patent: Mar. 20, 2012

(54) USING RAY TRACING FOR REAL TIME AUDIO SYNTHESIS

(75) Inventor: Robert Allen Shearer, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 1400 days.

(21) Appl. No.: 11/688,344

(22) Filed: Mar. 20, 2007

(65) Prior Publication Data

US 2008/0232602 A1 Sep. 25, 2008

(51) Int. Cl.
*H03G 3/00* (2006.01)

(52) U.S. Cl. ............................... 381/64; 381/61; 463/35

(58) Field of Classification Search .............. 381/61–62, 381/17, 309–310, 1, 64, 63; 463/31–32, 463/35; 455/440, 419–421, 418
See application file for complete search history.

(56) References Cited

U.S. PATENT DOCUMENTS

| | | | | |
|---|---|---|---|---|
| 6,597,359 | B1 * | 7/2003 | Lathrop | 345/440 |
| 6,829,017 | B2 * | 12/2004 | Phillips | 348/738 |
| 7,012,604 | B1 * | 3/2006 | Christie et al. | 345/426 |
| 2004/0002380 | A1 * | 1/2004 | Brosnan et al. | 463/32 |
| 2005/0233799 | A1 * | 10/2005 | LeMay et al. | 463/20 |
| 2006/0029243 | A1 * | 2/2006 | Gerrard et al. | 381/310 |
| 2007/0196801 | A1 * | 8/2007 | Nagasaka et al. | 434/262 |

* cited by examiner

*Primary Examiner* — Devona Faulk
*Assistant Examiner* — Disler Paul
(74) *Attorney, Agent, or Firm* — Patterson & Sheridan LLP

(57) ABSTRACT

According to embodiments of the invention, a sound engine may determine a final sound at a listener location by emulating sound waves within a three-dimensional scene. The sound engine may emulate sound waves by issuing rays from a location of a sound event and tracing the rays through the three-dimensional scene. The rays may intersect objects within the three-dimensional scene which have sound modification factors. The sound modification factors and other factors (e.g., distance traveled by the ray, angle of intersection with the object, etc.) may be applied to the sound event to determine a final sound which is heard by the listener.

20 Claims, 27 Drawing Sheets

FIG. 8 (FRAME N)

FIG. 9 (FRAME N)

*FIG. 10 (FRAME N+1)*

*FIG. 11 (FRAME N+1)*

USING RAY TRACING FOR REAL TIME AUDIO SYNTHESIS

BACKGROUND OF THE INVENTION

1. Field of the Invention

Embodiments of the invention generally relate to the field of computer processing.

2. Description of the Related Art

Often simulated environments, such as those featured in video game systems, include audio or sound effects to make the simulated environment seem more realistic. For example, if an explosion occurs within an environment simulated by a video game system, the video game system may add more realism to the environment by simulating the sound of an explosion.

One technique of simulating sounds within a three-dimensional scene may be to calculate the resulting sound at the location of the listener due to the propagation of sound waves throughout the three-dimensional scene. A sound wave is a longitudinal wave produced by variations in a medium (e.g., air) which is detected by the human ear. A game system may calculate the effects of all objects on all sound waves (e.g., collisions, constructive/destructive interference, etc.) as they travel through three-dimensions. Furthermore, the sound engine may calculate the resulting sound due to a number of sound waves which reach the listener location. However, calculating the propagation of sound waves throughout the three-dimensional scene interference may result in a large number of complex calculations (e.g., differential equations) which a game system may be unable to perform in a time frame necessary to provide real time sound effects.

Therefore, there exists a need for efficient and accurate techniques and devices to provide real time sound effects in a simulated environment.

SUMMARY OF THE INVENTION

Embodiments of the present invention generally provide methods and apparatus for producing sound effects in a simulated environment.

According to one embodiment of the invention, a method of simulating sound in a three-dimensional scene is provided. The method generally comprising: generating a sound event at a first location in the three-dimensional scene; issuing at least one ray into the three-dimensional scene originating from the first location; performing ray tracing with the at least one ray; based on the results of ray tracing the at least one ray through the three-dimensional scene, determining a resulting sound at a second location within the three-dimensional scene; and generating an output signal used to generate the resulting sound.

According to another embodiment of the invention a computer readable medium containing a program is provided. The program, when executed, performs operations generally comprising: generating a sound event at a first location in a three-dimensional scene; issuing at least one ray into the three-dimensional scene originating from the first location; performing ray tracing with the at least one ray; and based on the results of ray tracing the at least one ray through the three-dimensional scene, determining a resulting sound at a second location within the three-dimensional scene.

According to another embodiment of the invention a system is provided. The system generally comprising: a memory device containing a spatial index having nodes which correspond to bounding volumes which partition a three-dimensional scene; and a processing element configured to issue at least one ray into the three-dimensional scene originating from a first location corresponding to a sound event, perform ray tracing with the at least one ray, and based on the results of ray tracing the at least one ray through the three-dimensional scene, determine a resulting sound at a second location within the three-dimensional scene.

DETAILED DESCRIPTION OF THE PREFERRED EMBODIMENTS

Figure 1:
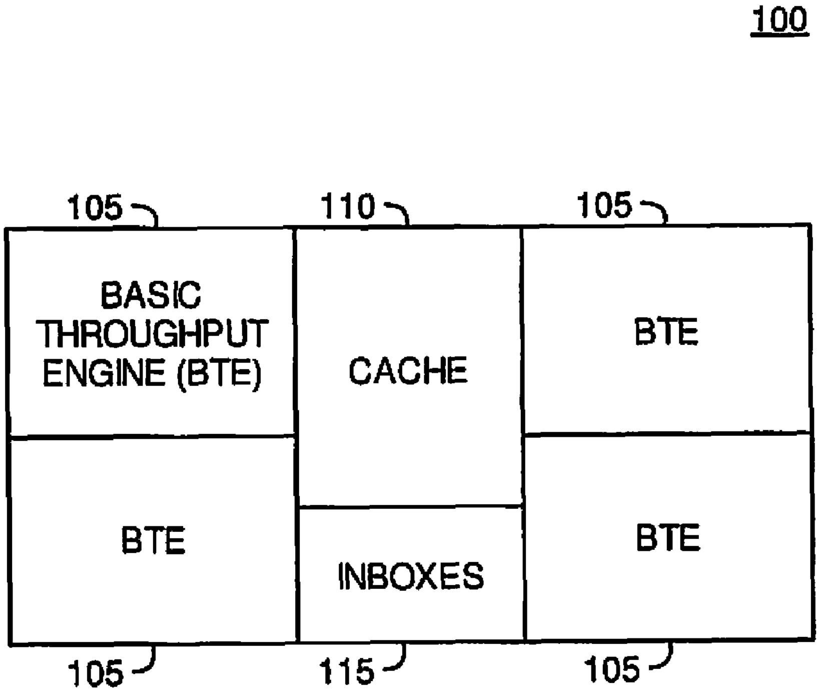
FIGS. 1, 5 and 17 illustrate multiple core processing elements, according to embodiments of the invention.

Embodiments of the invention provide methods and apparatus to provide real time sound effects in a simulated environment. According to embodiments of the invention, a sound engine may use rays and ray tracing to emulate sound waves within a three-dimensional scene. The sound engine may cast rays from the location of a sound event with trajectories directed away from the sound event, and may perform ray tracing with the rays to determine if the rays intersect objects within the three-dimensional scene. If the rays intersect objects within the three-dimensional scene, the sound engine may determine factors (e.g., factors based on the intersected object) which may modify the sound, and may cast additional rays from the intersected objects with a trajectory directed towards the listener location. The sound engine may perform ray tracing with the additional rays to determine if the sound reaches the listener location. For sound rays which reach the listener location, the sound engine may modify the sound according to various factors (e.g., based on the intersected objects, distance traveled by the rays, etc.), and the sound engine may then combine the modified sounds for all rays which reach the listener location to determine a final sound. Further, according to embodiments of the invention, the sound engine may play the resulting sound.

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, in various embodiments the invention provides numerous advantages over the prior art. However, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

One embodiment of the invention is implemented as a program product for use with a computer system. The program(s) of the program product defines functions of the embodiments (including the methods described herein) and can be contained on a variety of computer-readable media. Illustrative computer-readable media include, but are not limited to: (i) information permanently stored on non-writable storage media (e.g., read-only memory devices within a computer such as CD-ROM disks readable by a CD-ROM drive); (ii) alterable information stored on writable storage media (e.g., floppy disks within a diskette drive or hard-disk drive); and (iii) information conveyed to a computer by a communications medium, such as through a computer or telephone network, including wireless communications. The latter embodiment specifically includes information downloaded from the Internet and other networks. Such computer-readable media, when carrying computer-readable instructions that direct the functions of the present invention, represent embodiments of the present invention.

In general, the routines executed to implement the embodiments of the invention, may be part of an operating system or a specific application, component, program, module, object, or sequence of instructions. The computer program of the present invention typically is comprised of a multitude of instructions that will be translated by the native computer into a machine-readable format and hence executable instructions. Also, programs are comprised of variables and data structures that either reside locally to the program or are found in memory or on storage devices. In addition, various programs described hereinafter may be identified based upon the application for which they are implemented in a specific embodiment of the invention. However, it should be appreciated that any particular program nomenclature that follows is used merely for convenience, and thus the invention should not be limited to use solely in any specific application identified and/or implied by such nomenclature.

An Exemplary Processor Layout and Communications Network

FIG. 1 illustrates a multiple core processing element 100, according to one embodiment of the invention. The multiple core processing element 100 includes a plurality of basic throughput engines 105 (BTEs). A BTE 105 may contain a plurality of processing threads and a core cache (e.g., an L1 cache). The processing threads located within each BTE may have access to a shared multiple core processing element cache 110 (e.g., an L2 cache).

The BTEs 105 may also have access to a plurality of inboxes 115. The inboxes 115 may be memory mapped address space. The inboxes 115 may be mapped to the processing threads located within each of the BTEs 105. Each thread located within the BTEs may have a memory mapped inbox and access to all of the other memory mapped inboxes 115. The inboxes 115 make up a low latency and high bandwidth communications network used by the BTEs 105.

The BTEs may use the inboxes 115 as a network to communicate with each other and redistribute data processing work amongst the BTEs. For some embodiments, separate outboxes may be used in the communications network, for example, to receive the results of processing by BTEs 105. For other embodiments, inboxes 115 may also serve as outboxes, for example, with one BTE 105 writing the results of a processing function directly to the inbox of another BTE 105 that will use the results.

The aggregate performance of an image processing system may be tied to how well the BTEs can partition and redistribute work. The network of inboxes 115 may be used to collect and distribute work to other BTEs without corrupting the shared multiple core processing element cache 110 with BTE communication data packets that have no frame to frame coherency. An image processing system which can render many millions of triangles per frame may include many BTEs 105 connected in this manner.

In one embodiment of the invention, the threads of one BTE 105 may be assigned to a workload manager. An image processing system may use various software and hardware components to render a two-dimensional image from a three-dimensional scene. According to one embodiment of the invention, an image processing system may use a workload manager to traverse a spatial index with a ray issued by the image processing system. A spatial index, as described further below with regards to FIG. 4, may be implemented as a tree type data structure used to partition a relatively large three-dimensional scene into smaller bounding volumes. An image processing system using a ray tracing methodology for image processing may use a spatial index to quickly determine ray-bounding volume intersections. In one embodiment of the invention, the workload manager may perform ray-bounding volume intersection tests by using the spatial index.

In one embodiment of the invention, other threads of the multiple core processing element BTEs 105 on the multiple core processing element 100 may be vector throughput engines. After a workload manager determines a ray-bounding volume intersection, the workload manager may issue (send), via the inboxes 115, the ray to one of a plurality of vector throughput engines. The vector throughput engines may then determine if the ray intersects a primitive contained within the bounding volume. The vector throughput engines may also perform operations relating to determining the color of the pixel through which the ray passed.

Figure 2:
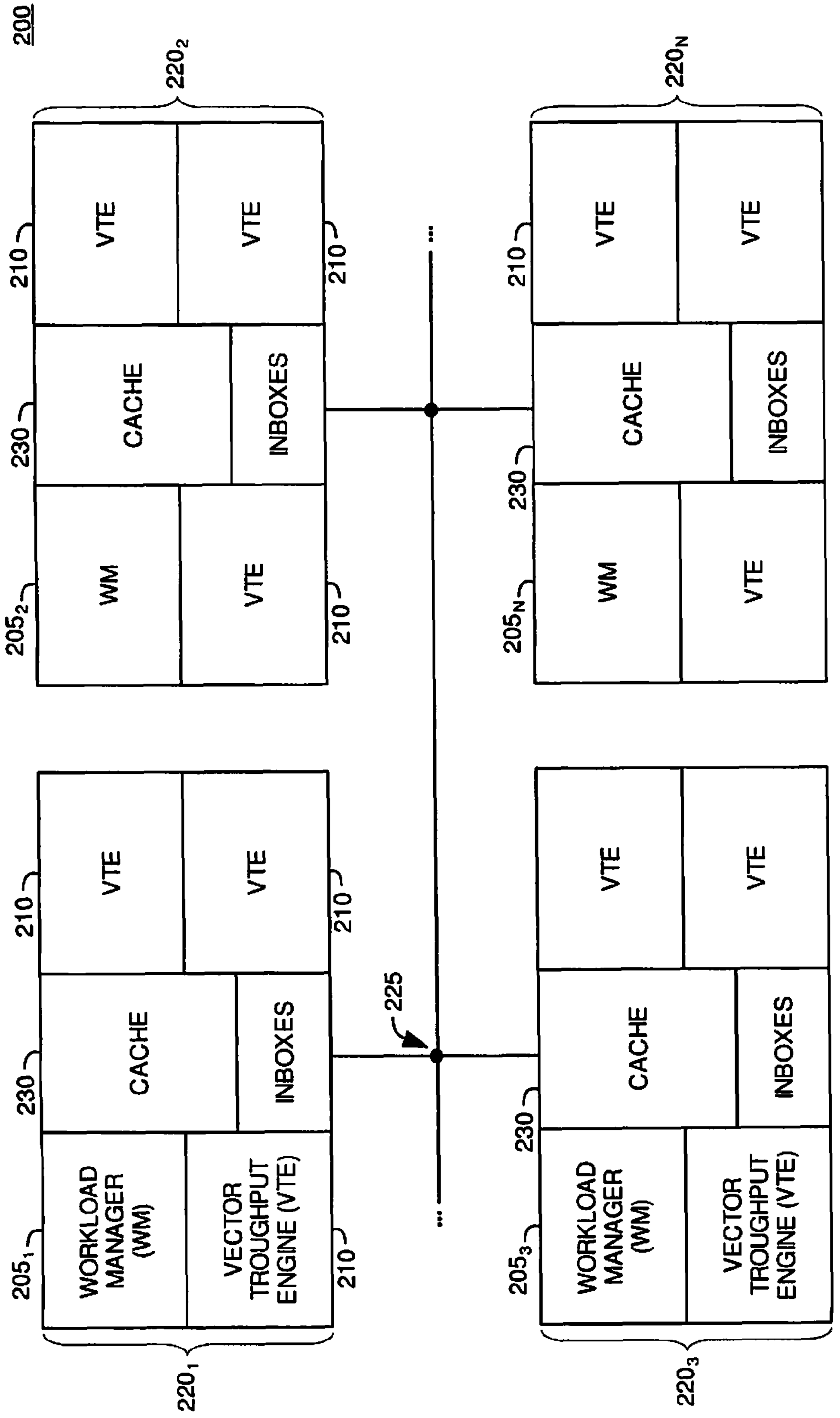
FIG. 2 illustrates multiple core processing element networks, according to embodiments of the invention.

FIG. 2 illustrates a network of multiple core processing elements 200, according to one embodiment of the invention. FIG. 2 also illustrates one embodiment of the invention where the threads of one of the BTEs of the multiple core processing element 100 is a workload manager 205. Each multiple core processing element $\mathbf{220}_{1\text{-}N}$ in the network of multiple core processing elements 200 may contain one workload manager $\mathbf{205}_{1\text{-}N}$, according to one embodiment of the invention. Each multiple core processing element $\mathbf{220}_{1\text{-}N}$ in the network of multiple core processing elements 200 may also contain a plurality of vector throughput engines 210, according to one embodiment of the invention.

The workload managers $\mathbf{205}_{1\text{-}N}$ may use a high speed bus 225 to communicate with other workload managers $\mathbf{205}_{1\text{-}N}$ and/or vector throughput engines 210 of other multiple core processing elements $\mathbf{220}_{1\text{-}N}$, according to one embodiment of the invention. Each of the vector throughput engines 210 may use the high speed bus 225 to communicate with other vector throughput engines 210 or the workload managers $\mathbf{205}_{1\text{-}N}$. The workload manager processors 205 may use the high speed bus 225 to collect and distribute image processing related tasks to other workload managers $\mathbf{205}_{1\text{-}N}$, and/or distribute tasks to other vector throughput engines 210. The use of a high speed bus 225 may allow the workload managers $\mathbf{205}_{1\text{-}N}$ to communicate without affecting the caches 230 with data packets related to workload manager communications.

An Exemplary Three-Dimensional Scene

Figure 3:
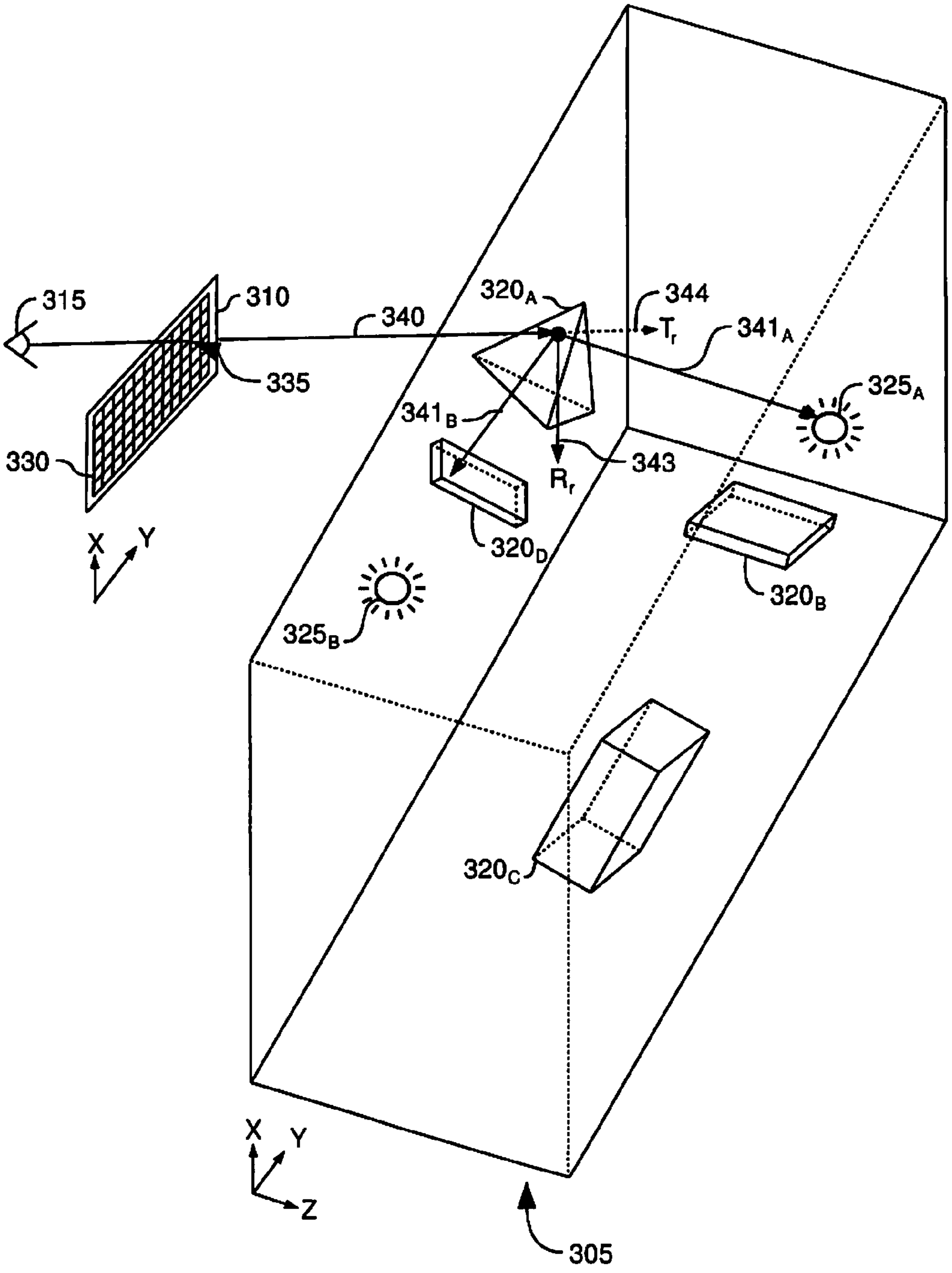
FIG. 3 is an exemplary three-dimensional scene to be rendered by an image processing system, according to one embodiment of the invention.

FIG. 3 is an exemplary three-dimensional scene 305 to be rendered by an image processing system. Within the three-dimensional scene 305 may be objects 320. The objects 320 in FIG. 3 are of different geometric shapes. Although only four objects 320 are illustrated in FIG. 3, the number of objects in a typical three-dimensional scene may be more or less. Commonly, three-dimensional scenes will have many more objects than illustrated in FIG. 3.

As can be seen in FIG. 3 the objects are of varying geometric shape and size. For example, one object in FIG. 3 is a pyramid $\mathbf{320}_A$. Other objects in FIG. 3 are boxes $\mathbf{320}_{B\text{-}D}$. In many modern image processing systems objects are often broken up into smaller geometric shapes (e.g., squares, circles, triangles, etc.). The larger objects are then represented by a number of the smaller simple geometric shapes. These smaller geometric shapes are often referred to as primitives.

Also illustrated in the scene 305 are light sources $\mathbf{325}_{A\text{-}B}$. The light sources may illuminate the objects 320 located within the scene 305. Furthermore, depending on the location of the light sources 325 and the objects 320 within the scene 305, the light sources may cause shadows to be cast onto objects within the scene 305.

The three-dimensional scene 305 may be rendered into a two-dimensional picture by an image processing system. The image processing system may also cause the two-dimensional picture to be displayed on a monitor 310. The monitor 310 may use many pixels 330 of different colors to render the final two-dimensional picture.

One method used by image processing systems to render a three-dimensional scene 305 into a two-dimensional picture is called ray tracing. Ray tracing is accomplished by the image processing system "issuing" or "shooting" rays from the perspective of a viewer 315 into the three-dimensional scene 320. The rays have properties and behavior similar to light rays.

One ray 340, that originates at the position of the viewer 315 and traverses through the three-dimensional scene 305, can be seen in FIG. 3. As the ray 340 traverses from the viewer 315 to the three-dimensional scene 305, the ray 340 passes through a plane where the final two-dimensional picture will be rendered by the image processing system. In FIG. 3 this plane is represented by the monitor 310. The point the ray 340 passes through the plane, or monitor 310, is represented by a pixel 335.

As briefly discussed earlier, most image processing systems use a grid 330 of thousands (if not millions) of pixels to render the final scene on the monitor 310. The grid 330 may be referred to as a frame. Each individual pixel may display a different color to render the final composite two-dimensional picture on the monitor 310. An image processing system using a ray tracing image processing methodology to render a two-dimensional picture from a three-dimensional scene will calculate the colors that the issued ray or rays encounters in the three-dimensional scene. The image processing scene will then assign the colors encountered by the ray to the pixel through which the ray passed on its way from the viewer to the three-dimensional scene.

The number of rays issued per pixel may vary. Some pixels may have many rays issued for a particular scene to be rendered. In which case the final color of the pixel is determined by the each color contribution from all of the rays that were issued for the pixel. Other pixels may only have a single ray issued to determine the resulting color of the pixel in the two-dimensional picture. Some pixels may not have any rays issued by the image processing system, in which case their color may be determined, approximated or assigned by algorithms within the image processing system.

To determine the final color of the pixel 335 in the two-dimensional picture, the image processing system must determine if the ray 340 intersects an object within the scene. If the ray does not intersect an object within the scene it may be assigned a default background color (e.g., blue or black, representing the day or night sky). Conversely, as the ray 340 traverses through the three-dimensional scene 305 the ray 340 may strike objects. As the rays strike objects within the scene, the color of the object may be assigned to the pixel through which the ray passes. However, the color of the object must be determined before it is assigned to the pixel.

Many factors may contribute to the color of the object struck by the original ray 340. For example, light sources within the three-dimensional scene may illuminate the object. Furthermore, physical properties of the object may contribute to the color of the object. For example, if the object is reflective or transparent, other non-light source objects may then contribute to the color of the object.

In order to determine the effects from other objects within the three-dimensional scene, secondary rays may be issued from the point where the original ray 340 intersected the object. For example, shadow rays 341 may be issued to determine the contribution of light to the point where the original ray 340 intersected the object. If the object has translucent properties, the image processing system may issue a transmitted or a refracted ray 344 to determine what color or light to be transmitted through the body of the object. If the object has reflective properties, the image processing system may issue a reflected ray to determine what color or light is reflected onto the object 320.

One type of secondary ray may be a shadow ray. Each shadow ray may be traced from the point of intersection of the original ray and the object, to a light source within the three-dimensional scene 305. If the ray reaches the light source without encountering another object before the ray reaches the light source, then the light source will illuminate the object struck by the original ray at the point where the original ray struck the object.

For example, shadow ray $341_A$ may be issued from the point where original ray 340 intersected the object $320_A$, and may traverse in a direction towards the light source $325_A$. The shadow ray $341_A$ reaches the light source $325_A$ without encountering any other objects 320 within the scene 305. Therefore, the light source $325_A$ will illuminate the object $320_A$ at the point where the original ray 340 intersected the object $320_A$.

Other shadow rays may have their path between the point where the original ray struck the object and the light source blocked by another object within the three-dimensional scene. If the object obstructing the path between the point on the object the original ray struck and the light source is opaque, then the light source will not illuminate the object at the point where the original ray struck the object. Thus, the light source may not contribute to the color of the original ray and consequently neither to the color of the pixel to be rendered in the two-dimensional picture. However, if the object is translucent or transparent, then the light source may illuminate the object at the point where the original ray struck the object.

For example, shadow ray $341_B$ may be issued from the point where the original ray 340 intersected with the object $320_A$, and may traverse in a direction towards the light source $325_B$. In this example, the path of the shadow ray $341_B$ is blocked by an object $320_D$. If the object $320_D$ is opaque, then the light source $325_B$ will not illuminate the object $320_A$ at the point where the original ray 340 intersected the object $320_A$. However, if the object $320_D$ is translucent or transparent, the light source $325_B$ may illuminate the object $320_A$ at the point where the original ray 340 intersected the object $320_A$.

Another type of secondary ray is a transmitted or refracted ray. A refracted ray may be issued by the image processing system if the object with which the original ray intersected has transparent or translucent properties (e.g., glass). A refracted ray traverses through the object at an angle relative to the angle at which the original ray struck the object. For example, refracted ray 344 is seen traversing through the object $320_A$ which the original ray 340 intersected.

Another type of secondary ray is a transmitted or a refracted ray. If the object with which the original ray intersected has reflective properties (e.g. a metal finish), then a reflected ray will be issued by the image processing system to determine what color or light may be reflected onto the object. Reflected rays traverse away from the object at an angle relative to the angle at which the original ray intersected the object. For example, reflected ray 343 may be issued by the image processing system to determine what color or light may be reflected onto the object $320_A$ which the original ray 340 intersected.

The total contribution of color and light of all secondary rays (e.g., shadow rays, transmitted rays, reflected rays, etc.) will result in the final color of the pixel through which the original ray passed.

An Exemplary kd-Tree

One problem encountered when performing ray tracing is determining quickly and efficiently if an issued ray intersects any objects within the scene to be rendered. One methodology known by those of ordinary skill in the art to make the ray intersection determination more efficient is to use a spatial index. A spatial index divides a three-dimensional scene or world into smaller volumes (smaller relative to the entire three-dimensional scene) which may or may not contain primitives. An image processing system can then use the known boundaries of these smaller volumes to determine if a ray may intersect primitives contained within the smaller volumes. If a ray does intersect a volume containing primitives, then a ray intersection test can be run using the trajectory of the ray against the known location and dimensions of the primitives contained within that volume. If a ray does not intersect a particular volume, then there is no need to run ray-primitive intersection tests against the primitives contained within that volume. Furthermore, if a ray intersects a bounding volume which does not contain primitives then there is no need to run ray-primitive intersections tests against that bounding volume. Thus, by reducing the number of ray-primitive intersection tests which may be necessary, the use of a spatial index greatly increases the performance of a ray tracing image processing system. Some examples of different spatial index acceleration data structures are octrees, k dimensional Trees (kd-Trees), and binary space partitioning trees (BSP trees). While several different spatial index structures exist, for ease of describing embodiments of the present invention, a kd-Tree will be used in the examples to follow. However, those skilled in the art will readily recognize that embodiments of the invention may be applied to any of the different types of spatial indexes.

A kd-Tree uses axis aligned bounding volumes to partition the entire scene or space into smaller volumes. That is, the kd-Tree may divide a three-dimensional space encompassed by a scene through the use of splitting planes which are parallel to known axes. The splitting planes partition a larger space into smaller bounding volumes. Together the smaller bounding volumes make up the entire space in the scene. The determination to partition (divide) a larger bounding volume into two smaller bounding volumes may be made by the image processing system through the use of a kd-tree construction algorithm.

One criterion for determining when to partition a bounding volume into smaller volumes may be the number of primitives contained within the bounding volume. That is, as long as a bounding volume contains more primitives than a predetermined threshold, the tree construction algorithm may continue to divide volumes by drawing more splitting planes. Another criterion for determining when to partition a bounding volume into smaller volumes may be the amount of space contained within the bounding volume. Furthermore, a decision to continue partitioning the bounding volume may also be based on how many primitives may be intersected by the plane which creates the bounding volume.

The partitioning of the scene may be represented by a binary tree structure made up of nodes, branches and leaves. Each internal node within the tree may represent a relatively large bounding volume, while the node may contain branches to sub-nodes which may represent two relatively smaller partitioned volumes resulting after a partitioning of the relatively large bounding volume by a splitting plane. In an axis-aligned kd-Tree, each internal node may contain only two branches to other nodes. The internal node may contain branches (i.e., pointers) to one or two leaf nodes. A leaf node is a node which is not further sub-divided into smaller volumes and contains pointers to primitives. An internal node may also contain branches to other internal nodes which are further sub-divided. An internal node may also contain the information needed to determine along what axis the splitting plane was drawn and where along the axis the splitting plane was drawn.

Exemplary Bounding Volumes

Figure 4A:
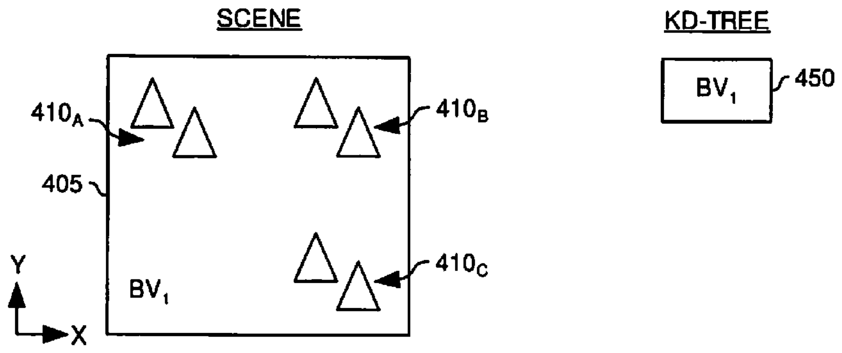
FIGS. 4A-4C illustrate a two-dimensional space to be rendered by an image processing system and a corresponding spatial index created by an image processing system, according to embodiments of the invention.
Figure 4B:
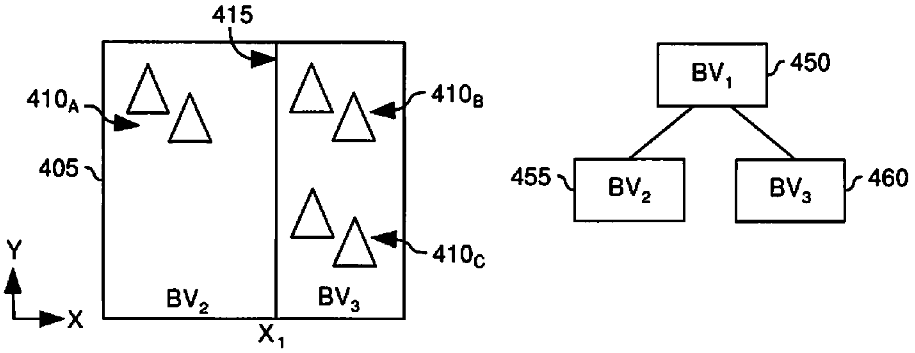
Figure 4C:
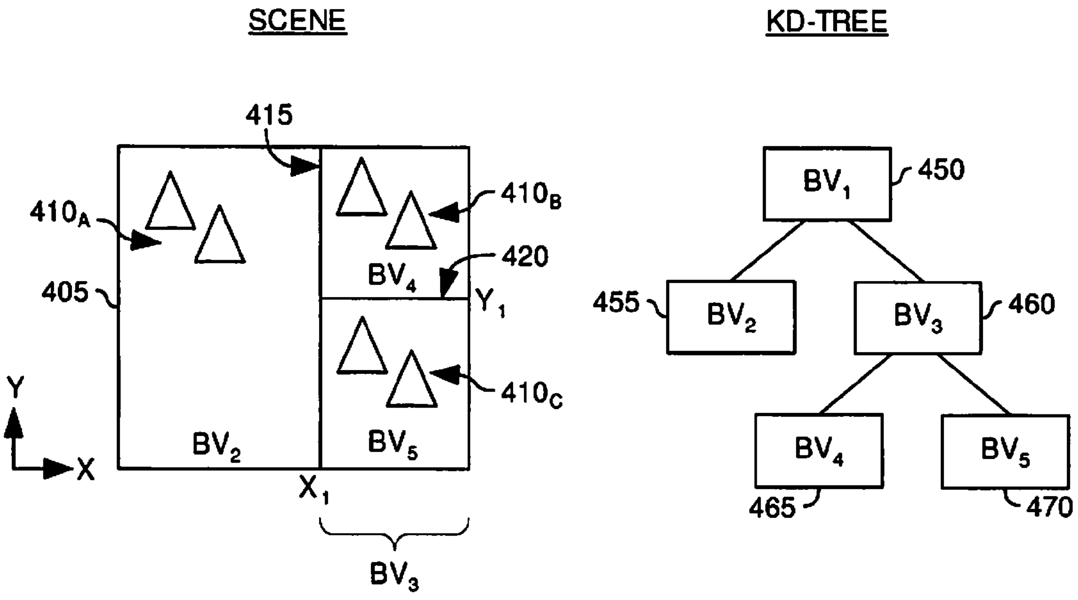

FIGS. 4A-4C illustrate a two-dimensional space to be rendered by an image processing system and a corresponding kd-tree. For simplicity, a two-dimensional scene is used to illustrate the building of a kd-Tree, however kd-Trees may also be used to represent three-dimensional scenes. In the two-dimensional illustration of FIGS. 4A-4C splitting lines are illustrated instead of splitting planes, and bounding areas are illustrated instead of bounding volumes as would be used in a three-dimensional structure. However, one skilled in the art will quickly recognize that the concepts may easily be applied to a three-dimensional scene containing objects.

FIG. 4A illustrates a two-dimensional scene 405 containing primitives 410 to be rendered in the final picture to be displayed on a monitor 310. The largest volume which represents the entire volume of the scene is encompassed by bounding volume 1 ($BV_1$). In the corresponding kd-Tree this may be represented by the top level node 450, also known as the root or world node. In one embodiment of an image processing system, an image processing system may continue to partition bounding volumes into smaller bounding volumes when the bounding volume contains, for example, more than two primitives. As noted earlier the decision to continue partitioning a bounding volume into smaller bounding volumes may be based on many factors, however for ease of explanation in this example the decision to continue partitioning a bounding volume is based only on the number of primitives. As can be seen in FIG. 4A, $BV_1$ contains six primitives, therefore kd-Tree construction algorithm may partition $BV_1$ into smaller bounding volumes.

FIG. 4B illustrates the same two-dimensional scene 405 as illustrated in FIG. 4A. However, in FIG. 4B the tree construction algorithm has partitioned $BV_1$ into two smaller bounding volumes $BV_2$ and $BV_3$. The partitioning of $BV_1$, was accomplished, by drawing a splitting plane $SP_1$ 415 along the x-axis at point $x_1$. This partitioning of $BV_1$ is also reflected in the kd-Tree as the two nodes 455 and 460, corresponding to $BV_2$ and $BV_3$ respectively, under the internal or parent node $BV_1$ 450. The internal node representing $BV_1$ may now store information such as, but not limited to, pointers to the two nodes beneath $BV_1$ (e.g., $BV_2$ and $BV_3$), along which axis the splitting plane was drawn (e.g., x-axis), and where along the axis the splitting plane was drawn (e.g., at point $x_1$).

The kd-Tree construction algorithm may continue to partition bounding volume $BV_3$ because it contains more than the predetermined threshold of primitives (e.g., more than two primitives). However, the kd-Tree construction algorithm may not continue to partition bounding volume $BV_2$, because bounding volume $BV_2$ contains less than or equal to the number of primitives (e.g., only two primitives 410$_A$). Nodes which are not partitioned or sub-divided any further, such as $BV_2$, are referred to as leaf nodes.

FIG. 4C illustrates the same two-dimensional scene 405 as illustrated in FIG. 4B. However, in FIG. 4C the kd-Tree construction algorithm has partitioned $BV_3$ into two smaller bounding volumes $BV_4$ and $BV_5$. The kd-construction algorithm has partitioned $BV_3$ using a partitioning plane along the y-axis at point $y_1$. Since $BV_3$ has been partitioned into two sub-nodes it may now be referred to as an internal node. The partitioning of $BV_3$ is also reflected in the kd-Tree as the two leaf nodes 465 and 470, corresponding to $BV_4$ and $BV_5$ respectively. $BV_4$ and $BV_5$ are leaf nodes because the volumes they represent are not further divided into smaller bounding volumes. The two leaf nodes, $BV_4$ and $BV_5$, are located under the internal node $BV_3$ which represents the bounding volume which was partitioned in the kd-Tree.

The internal node representing $BV_3$ may store information such as, but not limited to, pointers to the two leaf nodes (i.e., $BV_4$ and $BV_5$), along which axis the splitting plane was drawn (i.e., y-axis), and where along the axis the splitting plane was drawn (i.e., at point $y_1$).

The kd-Tree construction algorithm may now stop partitioning the bounding volumes because all bounding volumes located within the scene contain less than or equal to the maximum predetermined number of primitives which may be enclosed within a bounding volume. The leaf nodes may contain pointers to the primitives which are enclosed within the bounding volumes each leaf represents. For example, leaf node $BV_2$ may contain pointers to primitives 410$_A$, leaf node $BV_4$ may contain pointers to primitives 410$_B$, and leaf node $BV_5$ may contain pointers to primitives 410$_C$.

A ray tracing image processing system may use the workload manager 205 to traverse the spatial index (kd-Tree). Traversing the kd-Tree may include selecting a branch to a node on a lower level (sub-node) of the kd-Tree to take or proceed to in order to determine if the ray intersects any primitives contained within the sub-node. A workload manager 205 may use the coordinates and trajectory of an issued ray to traverse or navigate through the kd-Tree. By executing ray-bounding volume intersection tests, the workload manager 205 may determine if the ray intersects a plane of the bounding volumes represented by nodes within the kd-Tree structure. If the ray intersects a bounding volume which contains only primitives (i.e., a leaf node), then the workload manager 205 may send the ray and associated information to a vector throughput engine 210 for ray-primitive intersection tests. A ray-primitive intersection test may be executed to determine if the ray intersects the primitives within the bounding volume. This methodology results in fewer ray-primitive intersection tests needed to determine if a ray intersects an object within the scene, in comparison to running ray-primitive intersection tests for a ray against each primitive contained within the scene.

The resulting kd-Tree structure, or other spatial index structure, may be stored in a processor cache 230. The kd-Tree and the size of corresponding data which comprises the kd-Tree may be optimized for storage in a processor cache 230. The storage of the kd-Tree in a processor cache 230 may allow a workload manager 205 to traverse the kd-Tree with a ray that has been issued by the image processing system without having to retrieve the kd-Tree from memory every time a ray is issued by the image processing system.

Physics Engine

A physics engine is an application which may simulate real world physical phenomena as applied to objects within a three-dimensional scene. A physics engine may be used to simulate and predict the effects of physical phenomena on a frame to frame basis. For example, the physics engine may perform position updates for an object if the object is moving, and may perform collision detection tests to determine if an object collides with any other objects within the three-dimensional scene.

An image processing system may be used in conjunction with a physics engine to render the simulated physical interactions and objects within a three-dimensional scene to a two-dimensional screen. For example, a video game engine may use both a physics engine and an image processing system to simulate object movements or interactions within a three-dimensional scene and to display the objects and the environment on a monitor.

Figure 5:
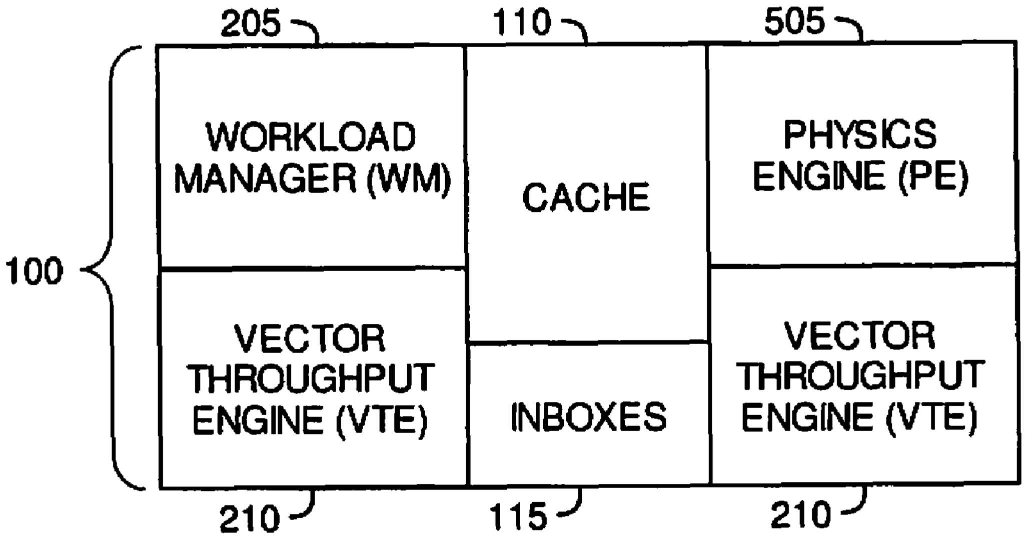

According to one embodiment of the invention, a physics engine may use multiple threads on a multiple core processing element to perform physics related calculations. For example, FIG. 5 illustrates a multiple core processing element 100 wherein the threads of one of the cores are allocated to a physics engine 505. Other cores within the multiple-core processing element may perform image processing related tasks, according to embodiments of the invention. For example, one core within the multiple-core processing element 100 may be allocated to a workload manager 205 and other cores within the multiple-core processing element 100 may be allocated to vector throughput engines 210, according to one embodiment of the invention.

The multiple-core processing element 100 may have a memory cache 110 shared between all of the cores located on the multiple-core processing element 100. Furthermore, each core may have its own cache (e.g., an L1 cache). The multiple-core processing element 100 may also contain inboxes 115. The inboxes 115 may be memory mapped address space used by the cores as a communications network.

Figure 6:
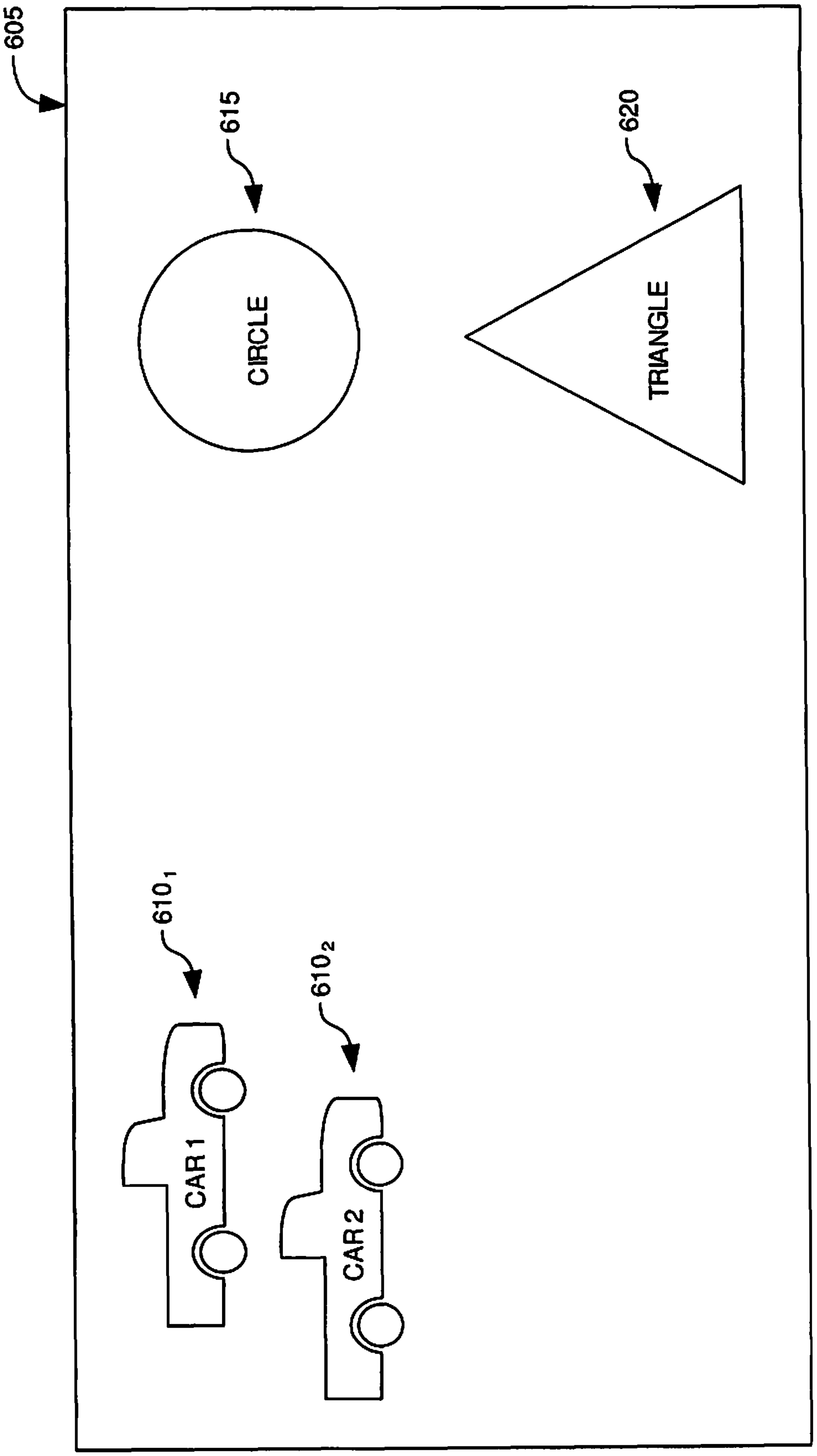
FIG. 6 illustrates an exemplary three-dimensional scene to be rendered by an image processing system, according to embodiments of the invention.

FIG. 6 illustrates an exemplary three-dimensional scene 605. The three-dimensional scene 605 contains several objects including a first car object $610_1$, a second car object $610_2$, a circle object 615, and a triangle object 620. A physics engine may simulate real world physical phenomena as applied to the objects (i.e., $610_1$, $610_2$, 615, and 620) within the three-dimensional scene 605 illustrated in FIG. 6.

One structure a physics engine may use to keep track of objects in a three-dimensional scene is a scene graph or a scene index. On a frame to frame basis, the physics engine 505 may use a scene graph to store and access information which defines the objects located within the three-dimensional scene. The scene graph may use a hierarchical structure (e.g., a tree) to index or order the objects.

Figure 7:
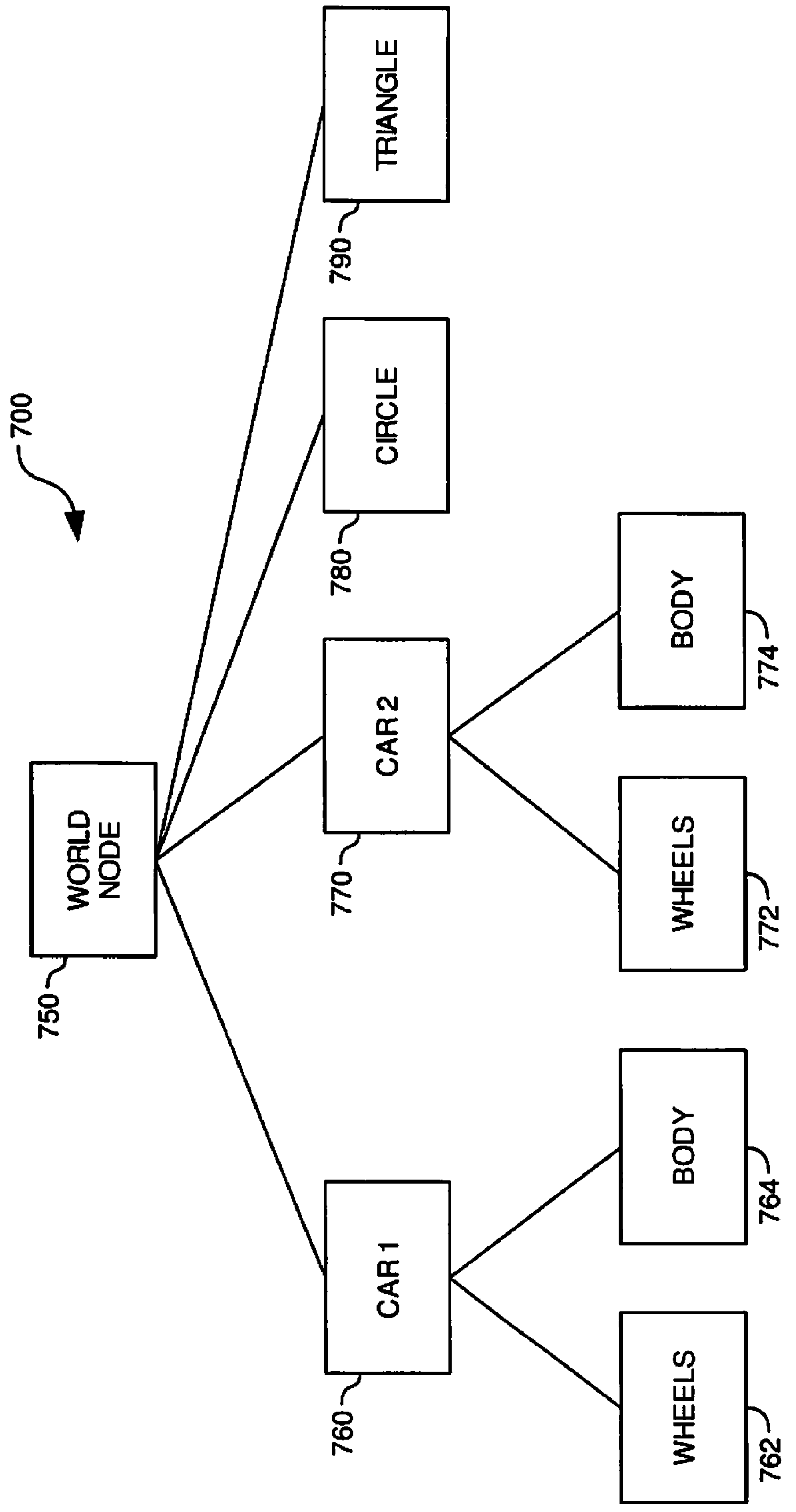
FIG. 7 illustrates a scene graph, according to one embodiment of the invention.

For example, FIG. 7 illustrates an exemplary scene graph 700, according to one embodiment of the invention. As illustrated, the scene graph 700 may contain a world node 750 which represents the entire three-dimensional scene 605. The world node 750 may branch to nodes which represent objects within the three-dimensional scene. For example, the world node 750 may branch to four object nodes. Each of the four object nodes in the scene graph 700 may correspond to one of the four objects within the three-dimensional scene 605 of FIG. 6 (i.e., a node 760 corresponding to the first car object $610_1$, a node 770 corresponding to the second car object $610_2$, a node 780 corresponding to the circle object 615, and a node 790 corresponding to the triangle object 620).

The object nodes may branch to other nodes on a lower level of the scene graph 700. The branched to nodes may represent objects which make up part of the larger object or may be nodes which define the object (position, color, mass, etc.). For example, the node 760 representing the first car object branches to a node 762 representing a wheels object and to a node 764 representing a body object. Thus, the scene graph is a hierarchical acceleration data structure based on objects located within a three-dimensional scene.

The scene graph may be stored, for example, in a memory cache (e.g., cache 110) of a processing element to enable the physics engine 505 fast access to the information contained within the scene graph 700. Because a scene graph 700 is an object oriented structure and a physics engine performs calculations on an object by object basis, a scene graph is an efficient structure to use with a physics engine.

In contrast to a physics engine using a scene graph, an image processing system may use a spatial index (e.g., a kd-tree) to render a two-dimensional image from a three-dimensional scene. As described previously with respect to FIG. 4, a spatial index partitions a three-dimensional scene based on a spatial or bounding volume hierarchy. Because a scene graph is a spatial based structure and a ray tracing image processing system performs calculations based on where a ray traverses through a three-dimensional scene, a spatial index is an efficient structure to use with a ray tracing image processing system.

Figure 8:
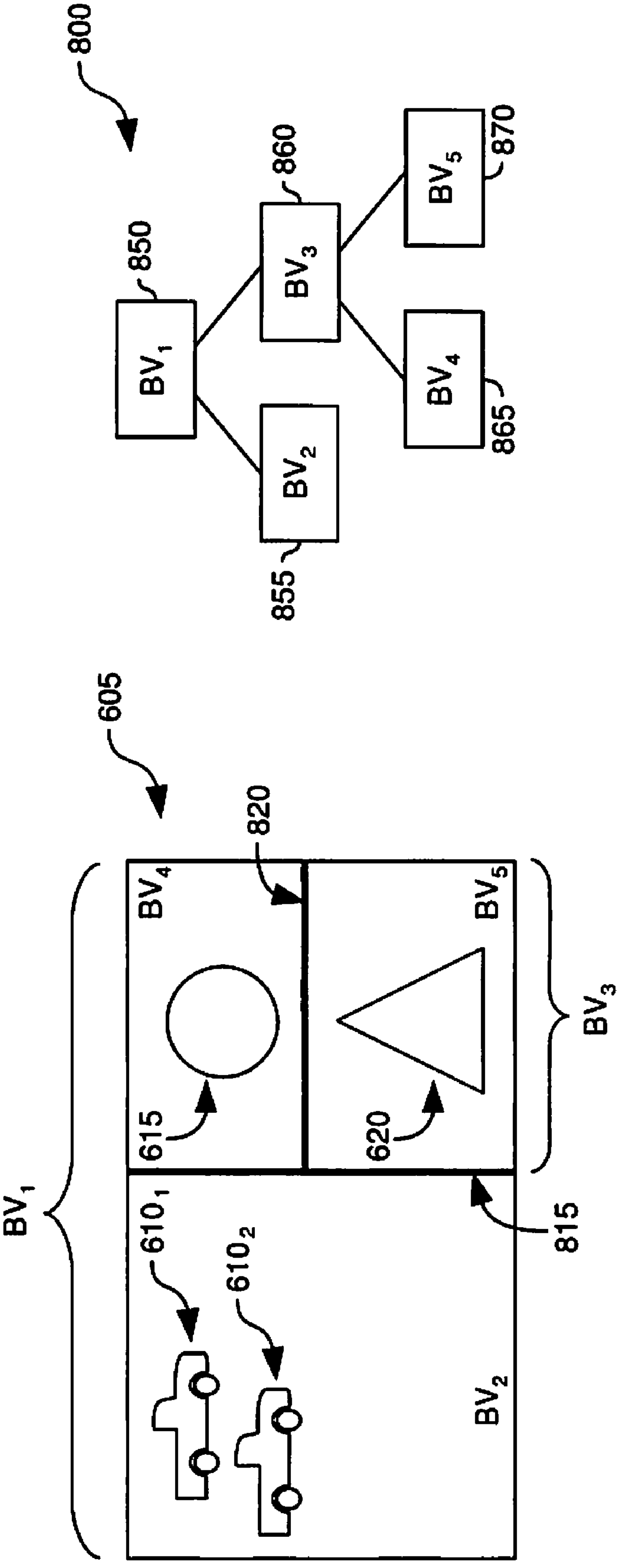
FIG. 8 illustrates a three-dimensional scene to be rendered by an image processing system and a corresponding spatial index, according to one embodiment of the invention.

FIG. 8 illustrates a spatial index 800 which may be used by an image processing system to render a two-dimensional image from the three-dimensional scene 605. The three-dimensional scene 605 illustrated in FIG. 7 may be the same three-dimensional scene 605 to which the scene graph 700 corresponds.

The spatial index 800 may contain a world node 850 which defines bounding volume 1 ($BV_1$) which encompasses the entire volume of the three-dimensional scene 605. $BV_1$ may be partitioned into two smaller bounding volumes $BV_2$ and $BV_3$ through the use of a splitting plane 815. The partitioning of $BV_1$ is reflected in the kd-Tree as the two nodes 855 and 860, corresponding to $BV_2$ and $BV_3$ respectively, under the internal or parent node $BV_1$ 850. The internal node 850 representing $BV_1$ may now store information such as, but not limited to, pointers to the two nodes beneath $BV_1$ (e.g., $BV_2$ and $BV_3$), along which axis the splitting plane 815 was drawn (e.g., x-axis), and where along the axis the splitting plane 815 was drawn.

Furthermore, $BV_3$ may be partitioned into two smaller bounding volumes $BV_4$ and $BV_5$. Two leaf nodes 865 and 870 in the spatial index may correspond to the bounding volumes $BV_4$ and $BV_5$, respectively.

The leaf nodes (i.e., 855, 865, and 870) of the spatial index 800 may include information which defines the corresponding bounding volumes within the three-dimensional scene (i.e., $BV_2$, $BV_4$ and $BV_5$) and may contain pointers to primitives located within the corresponding bounding volumes.

On a frame to frame basis, objects within the three-dimensional scene may move or change shape. In response to changes in position or shape of objects, the spatial index may need to be updated such that the spatial index accurately reflects the location of objects or primitives within the three-dimensional scene. Similarly, a scene graph used by the physics engine 505 may also need to be updated to accurately reflect the new position or shape of objects within the three-dimensional scene. Thus, in response to objects moving or changing shape, two data structures may need to be updated on a frame to frame basis.

The image processing system may store the spatial index 800, for example, in the memory cache (e.g., cache 110). As previously described, a scene graph may also be stored in the memory cache 110 of the multiple core processing element 100. However, in some circumstances the memory cache 110 may not have enough storage space available to efficiently store both the scene graph 700 and the spatial index 800.

Integrated Acceleration Data Structure for Physics and Ray Tracing Image Processing According to embodiments of the invention, an integrated acceleration data structure may be used by both the physics engine 505 and the image processing system in order to perform both physics calculations and to perform ray tracing respectively. A single integrated acceleration data structure may perform the functions of a spatial index and may simultaneously perform the functions of a scene graph. By using a single integrated acceleration data structure rather than using two data structures, the amount of space required to store information sufficient for both the physics engine 505 and the image processing system to perform their respective tasks may be reduced. Furthermore, in contrast to the need to update two data structures in response to movements of objects within the three-dimensional scene, the image processing system may only need to update a single data structure (i.e., the integrated acceleration data structure). The processing time gained by only updating a single data structure may reduce the time necessary to perform physics engine tasks and image processing tasks, thus increasing overall system performance.

According to one embodiment of the invention, an integrated spatial index may be formed by initially partitioning a three-dimensional scene into bounding volumes that encompass objects within the three-dimensional scene. Accordingly, the initial or top portions of the integrated acceleration data structure are formed based on a spatial or bounding volume hierarchy. Once a bounding volume encompasses an object within the three-dimensional scene, an object oriented hierarchy may be used to represent the object within the bounding volume. Thus, the lower portions of the integrated acceleration data structure are formed based on an object oriented hierarchy. Consequently, the initial or top portions of the integrated acceleration data structure may resemble a spatial index 800 (e.g., a kd-tree) and the lower portions of the integrated acceleration data structure may resemble a scene graph 700.

Figure 9:
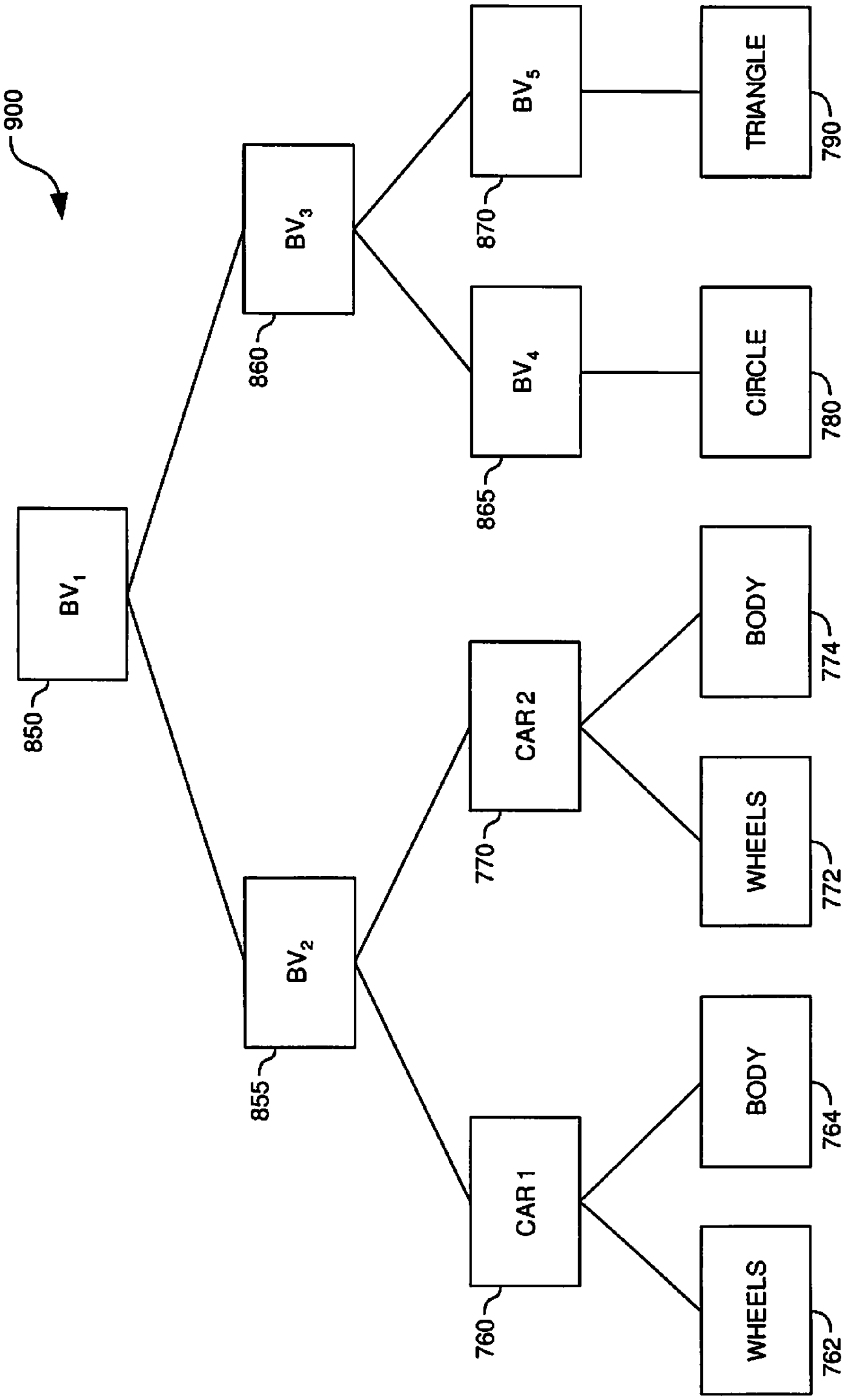
FIGS. 9, 11 and 15 illustrate integrated acceleration data structures, according to embodiments of the invention.

FIG. 9 illustrates an integrated acceleration data structure 900, according to one embodiment of the invention. The exemplary integrated acceleration data structure 900 corresponds to the three-dimensional scene 605 illustrated in FIG. 6.

The integrated acceleration data structure 900 illustrated in FIG. 9 has an initial structure defined by the spatial index 800 which was described with reference to FIG. 8, having a world node and smaller bounding volumes.

According to embodiments of the invention, in order to form an integrated acceleration data structure 900, the nodes which define bounding volumes within the three-dimensional scene may branch to (i.e., contain information which points to) nodes which define objects located within bounding volumes. Thus, in contrast to a spatial index where the final spatially oriented nodes (i.e., the leaf nodes) only point to primitives, the final spatially oriented nodes in an integrated acceleration data structure 900 may branch to object nodes which define objects.

For example, as illustrated in FIG. 9, node 855 corresponding to $BV_2$ may branch to object nodes 760 and 770 (representing the first car object $\mathbf{610}_1$ and the second car object $\mathbf{610}_2$) from the scene graph 700. The object nodes 760 and 770 are branched to from the node 855 corresponding to $BV_2$ because the first car object $\mathbf{610}_1$ and the second car object $\mathbf{610}_2$ are both located within bounding volume $BV_2$ as illustrated in FIG. 8.

Similar to the scene graph 700, the nodes branched to from each object node in the integrated acceleration data structure 900 may continue to define properties of the objects or portions of the object which collectively construct the object. For example, each car object node branches to a wheel object node (e.g., 762 or 772) and a body object node (e.g., 764 or 774), which further define each car object.

Also illustrated in the integrated acceleration data structure 900 are nodes corresponding to the remaining objects in the three-dimensional scene 605. For example, the circle object node 780 is branched to from the node 865 defining the bounding volume $BV_4$. The circle object node 780 may be branched to from the node 865 defining bounding volume $BV_4$, because the circle object 615 is located within bounding volume $BV_4$. Furthermore, the triangle object node 790 is branched to from the node 870 defining the bounding volume $BV_5$. The triangle object node 790 may be branched to from the node 865 defining bounding volume $BV_5$, because the triangle object 620 is located within bounding volume $BV_5$.

In order for a physics engine 505 or an image processing system to determine if a node corresponds to an object or to a bounding volume, each node within the integrated acceleration data structure may contain an object node flag or bit. The object node bit may be a single bit located within the memory space which defines a node within the integrated acceleration data structure 900. According to one embodiment of the invention, if a node within the spatial index is an object node, the object node bit may be asserted. Furthermore, if a node within the spatial index is not an object node, the object node bit may not be asserted. Thus, a physics engine 505 performing physics calculations or the image processing system performing ray tracing may be able to quickly determine if the node is an object node or a node defining a bounding volume by determining if the object node bit is asserted.

Integrated Acceleration Data Structure Usage

According to embodiments of the invention, an image processing system may perform ray tracing with an integrated acceleration data structure. As described with regards to FIG. 4, when using a spatial index (e.g., a kd-tree) the image processing system may use a workload manager 205 to issue rays into the three-dimensional scene and to trace the rays (based on the trajectory of the ray) through the three-dimensional scene. The workload manager 205 may trace rays through the three-dimensional scene using the spatial index by performing ray-bounding volume intersection tests against the bounding volumes defined by the nodes in the spatial index. The workload manager 205 may take branches to nodes based on which bounding volumes are intersected by the ray. When the workload manager 205 traverses to a certain point within the spatial index (e.g., a leaf node defining a bounding volume), the workload manager 205 may send the ray to a vector throughput engine 210 to determine if the ray intersects any primitives (e.g., contained within the bounding volume defined by the leaf node). If the ray intersects a primitive, the vector throughput engine 210 may consequently determine the color contribution to the two-dimensional image based on an intersected primitive. If not, the workload manager 205 may traverse the kd-tree again to determine if the ray intersects any other primitives located within the three-dimensional scene.

The image processing system may use an integrated acceleration data structure 900 to perform ray tracing, in a manner similar to using a spatial index. The image processing system may issue rays into the three-dimensional scene and trace rays through the three-dimensional scene using the integrated acceleration data structure 900 by performing ray-bounding volume intersection tests against the bounding volumes defined by the spatially oriented nodes in the spatial index. The workload manager 205 may take branches to nodes based on which bounding volumes are intersected by the ray. When the workload manager 205 traverses to a certain point within the integrated acceleration data structure (e.g., an object node), the workload manager 205 may send the ray to a vector throughput engine 210 to determine if the ray intersects any primitives. However, according to other embodiments of the invention, the workload manager 205 may determine if the ray intersects any primitives.

Furthermore, the physics engine 505 may perform physics related tasks using the integrated acceleration data structure. When using a scene graph the physics engine may determine the effect of physical phenomena on objects within the three-dimensional scene 605 on an object-by-object basis. The physics engine 505 may perform the same physics calculations with an integrated acceleration structure on an object-by-object basis by searching for object nodes within the integrated acceleration data structure 900. The physics engine 505 may determine if a node is an object node by checking the object node bit in the information which defines the node. Once a node is found within the integrated acceleration data structure that has its object node bit asserted, the physics engine may perform physics calculations on the object.

Thus, by forming a data structure which uses both a spatial (or bounding volume) oriented hierarchy and an object oriented hierarchy, a single data structure may be formed which may be used by both the image processing system and the physics engine 505.

Although in the preceding example the integrated acceleration data structure 900 has been described wherein each entire object may be contained within a single bounding volume, in some circumstances portions of objects may be located within two separate bounding volumes. That is, objects within the three-dimensional scene may be divided by a splitting plane which creates a boundary between bounding volumes. Consequently, portions of an object may be located within separate bounding volumes created by the splitting plane.

In this scenario, according to one embodiment of the invention, the information defining an object node may contain a bit location which indicates that information which defines the entire object is located within a plurality of object nodes within the integrated acceleration data structure. The bit within the information defining an object node may be asserted to indicate that information which defines the object may be located within a plurality of object nodes of the integrated acceleration data structure, and de-asserted to indicate that the information which defines the object is located entirely within the current object node.

Furthermore, if an object node which contained only a portion of an object was created when constructing the integrated acceleration data structure, a pointer to another object node (or nodes) which contain the remaining information which defines the object may be stored in each object node (which contains a portion of the object, according to one embodiment of the invention. Thus, the physics engine may quickly find the other object node(s) within the integrated acceleration data structure. By using a bit within the information defining an object node to indicate whether or not the object is defined within a plurality of object nodes, the likelihood may be reduced that a physics engine 505 performing position updates or collision detection tests fails to perform tests against all of the portions of an object located within the three-dimensional scene.

Figure 10:
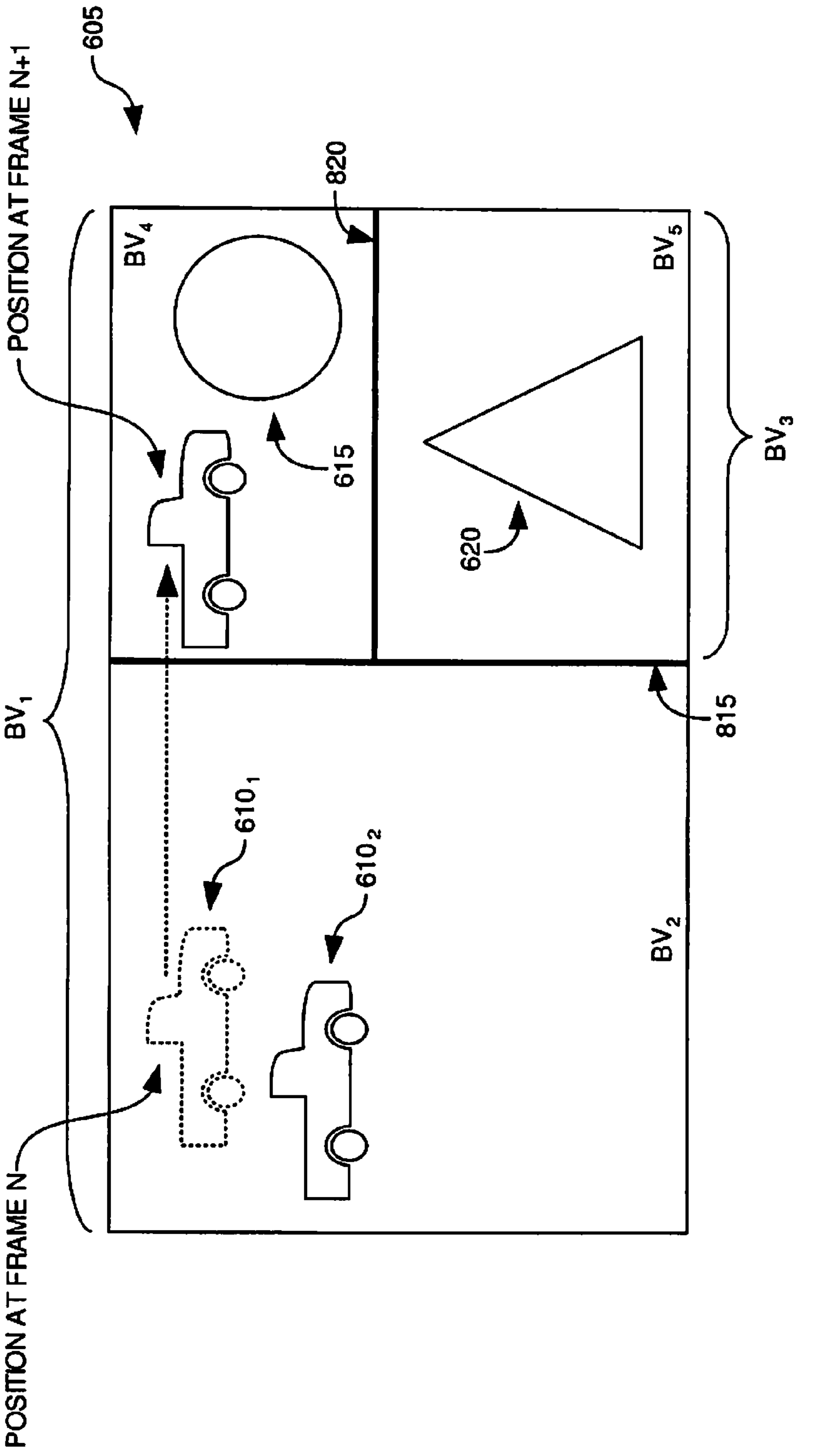
FIG. 10 illustrates a three-dimensional scene to be rendered by an image processing system, according to one embodiment of the invention.

Updating an Integrated Acceleration Data Structure in Response to Object Movements According to embodiments of the invention, an integrated acceleration data structure 900 may be used to maintain a record of movements or changes to objects located within the three-dimensional scene. For example, in contrast to the three-dimensional scene 605 illustrated in FIG. 6, FIG. 10 illustrates a three-dimensional scene 605B where the first car object 610$_1$ has moved from a first position in the frame N of the three-dimensional scene 605 to a second position in frame N+1 of the three-dimensional scene 605 (as illustrated by the dashed lines in FIG. 10).

In response to the movement of the first car object 610$_1$, hardware or software components within the image processing system may update the integrated acceleration data structure 900.

According to one embodiment of the invention, the physics engine 505 may update the integrated acceleration data structure 900 to reflect change in position or shape of objects within the three-dimensional scene 605. The physics engine 505 may perform position updates and collision detection tests for all of the objects located within the three-dimensional scene. For example, the object node 760 corresponding to the first car object 610$_1$ may be updated to reflect the new position of the first car object 610$_1$. After performing the tests, the physics engine 505 may record the results of the calculations (e.g., the new positions of the objects) in the integrated acceleration data structure 900.

Furthermore, if an object has moved such that the branches to nodes within the integrated acceleration data structure need to be updated, the physics engine 505 may update the branches as well. For example, the movement of the first car object 610 from its position illustrated in frame N of the three-dimensional scene 605 (as seen in FIG. 7) to its position illustrated in frame N+1 of the three-dimensional scene (as seen in FIG. 10) may require that the physics engine 505 update the position of the first car object 610$_1$ in the integrated acceleration data structure 900. Furthermore, as illustrated in FIG. 10 the first car object has moved to such a degree that it is no longer located within the bounding volume $BV_2$, rather the first car object 610$_1$ has moved such that it is located within the bounding volume $BV_4$. Thus, the physics engine 505 may update the integrated acceleration data structure 900 so that the node 865 corresponding to $BV_4$ branches to the object node 760 corresponding to the first car object 610$_1$.

Figure 11:
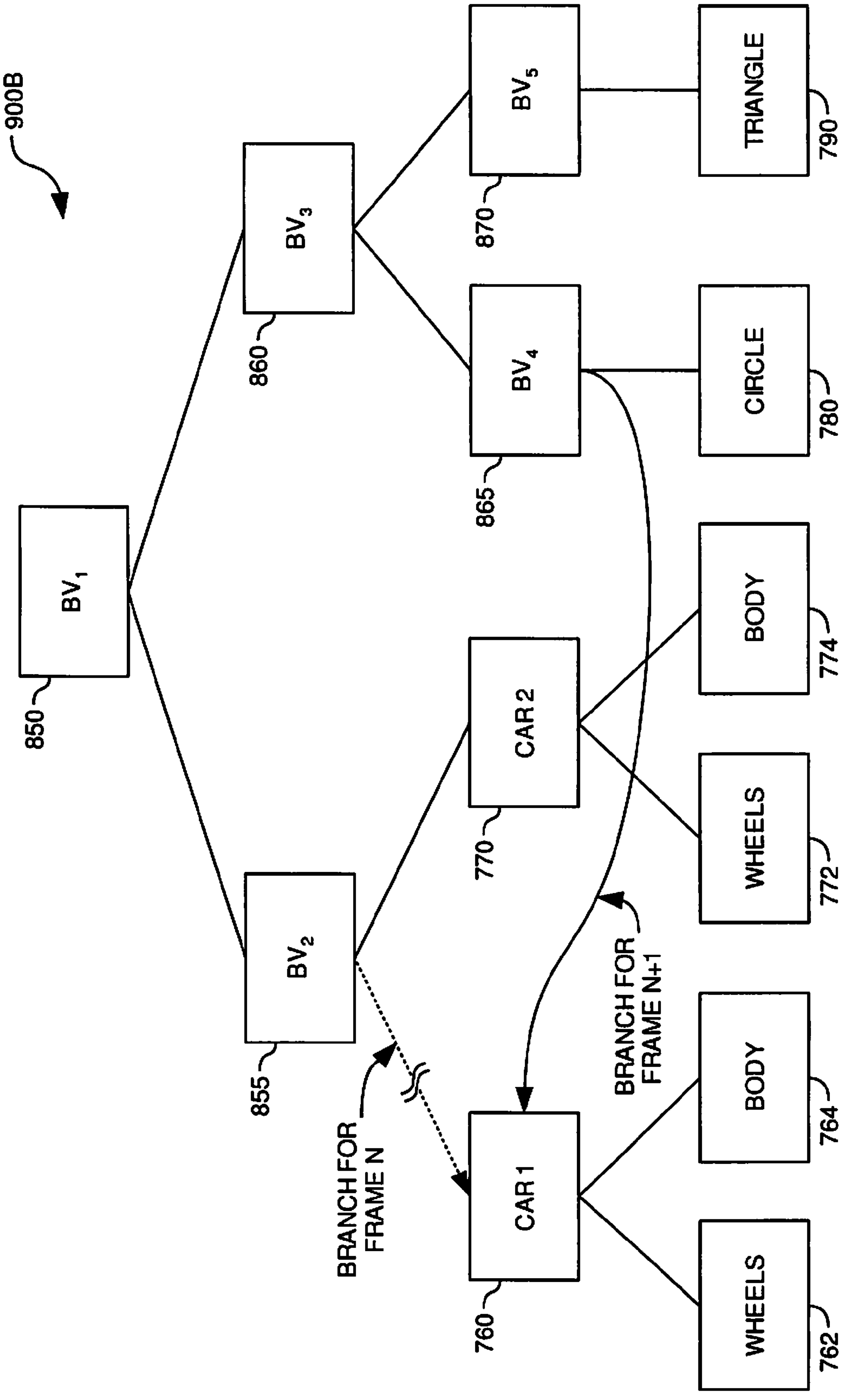

For example, FIG. 11 illustrates an updated integrated acceleration data structure 900B which reflects the new position of the first car object 610$_1$. The branch from the node 855 corresponding to $BV_2$ to the object node 760 corresponding to the first car object 610$_1$ may have been removed or deleted by the physics engine 505 to reflect the movement of the first car object 610$_1$ out of the bounding volume $BV_2$. Furthermore, a new branch from the spatial index node 865 corresponding to $BV_4$ to the object node 760 corresponding to the first car object 610$_1$ may have been added by the physics engine 505 to reflect the movement of the first car object 610$_1$ into the bounding volume $BV_4$. Thus, the new position of the first car object 610$_1$ in the three-dimensional scene 605 is now reflected in the updated integrated acceleration data structure 900B.

As illustrated in FIG. 11, the remaining nodes and branches in the updated integrated acceleration data structure 900B are the same as in the integrated acceleration data structure 900 because (in this simple example) no other objects moved from frame N to frame N+1. The image processing system may now use the updated integrated acceleration data structure 900B to render a two-dimensional image from the three-dimensional scene 605, and the physics engine 505 may use the updated integrated acceleration data structure 900B to perform physics related calculations.

Physics Engine Collision Detection

As mentioned above, one function of a physics engine is to perform collision tests. Collision tests may determine, for example, if an object which is moving within the three-dimensional scene collides with any other objects within the three-dimensional scene. If the moving object collides with any other objects, the physics engine may also perform calculations to determine the effects of the collision on the moving object and the objects with which the moving object collided (e.g., new direction, position, and/or shape of the objects). The physics engine may then update a data structure (e.g., the integrated acceleration data structure) with the results of the calculations, and the image processing system may use the updated data structure to render a two-dimensional image of the three-dimensional scene.

Figure 12:
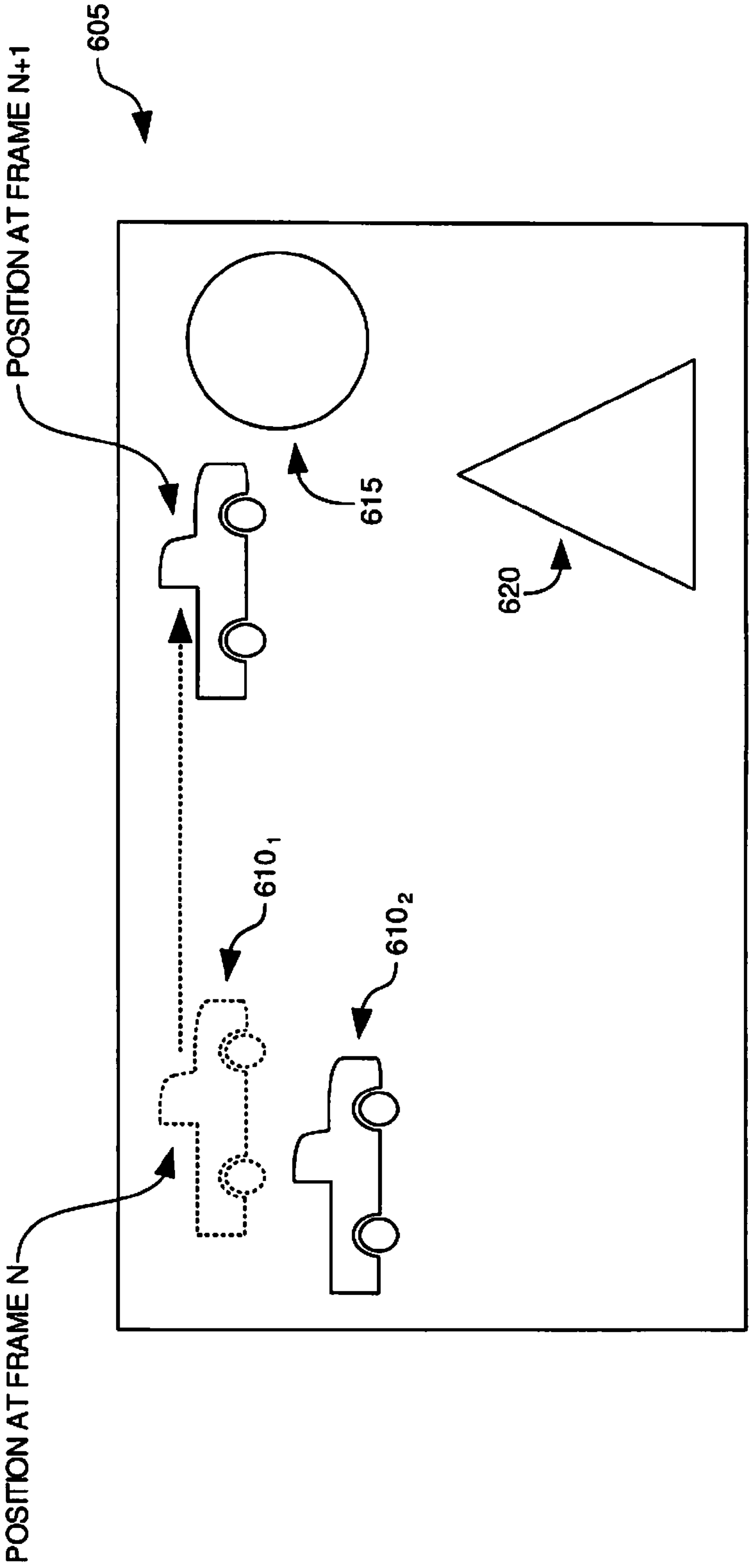
FIGS. 12, 13, and 16 illustrate exemplary three-dimensional scenes, according to embodiments of the invention.

FIG. 12 illustrates an exemplary three-dimensional scene 605 containing several objects including a first car object 610$_1$, a second car object 610$_2$, a circle object 615, and a triangle object 620. The first car object 610$_1$ may moving (at a given velocity) within the three-dimensional scene. Over a period of time (e.g., a single frame) the car object 610$_1$ may move from a first position (illustrated by the dashed outline of the car object 610$_1$) to a second position.

In order to provide realistic simulation of physical phenomenon, the physics engine may perform collision tests (collision detection tests) with the first car object 610$_1$ and each of the other objects within the three-dimensional scene to determine if the first car object 610$_1$ collides with any other objects within the three-dimensional scene over the time period (e.g., for a single frame).

For example, the physics engine may perform collision tests with the first car object 610$_1$ and the second car object 610$_2$, the first car object 610$_1$ and the circle object 615, and the first car object 610$_1$ and the triangle object 620. Although this technique may determine which objects collide with the moving object, the technique may execute collision tests with objects which are unlikely to collide with the moving object. For example, this technique may execute a collision test with the first car object 6101 and the triangle object 620 which are relatively far away from one another and are unlikely to collide. Therefore, this technique may be inefficient in determining collisions between the moving object and other objects.

However, a physics engine may reduce the number of collision tests which may be performed by only performing collision tests with objects that are likely to collide with the moving object. The physics engine may determine which objects are likely to collide with the moving object by creating a bounding volume which encloses the path of the moving object from the first position to the second position (hereinafter a "velocity box") and performing intersection tests with the velocity box and every other object within the three-dimensional scene. The objects which intersect the velocity box may be more likely to collide with the moving object. Therefore, the physics engine may use the objects which intersect with the velocity box to perform collision tests with the moving object to determine which objects collide with the moving object. Consequently, the number of collision tests may be reduced by the number objects which do not intersect the velocity box.

In contrast to an object-to-object collision test, a test for an intersection of the velocity box and an object within the three-dimensional scene may take less time and processing power. For example, a collision test may require many more variables such as the velocity of the moving object, direction in which the moving object is traveling, the coordinates of both objects (i.e., the moving object and the object being tested), and the dimensions of both objects. Whereas, an intersection test may simply require the dimensions and coordinates of the velocity box and the dimensions and coordinates of the other object being tested for an intersection with the velocity box. Consequently, it may be more efficient to execute intersection tests using a velocity box than to execute collision tests with every object within the three-dimensional scene.

Figure 13:
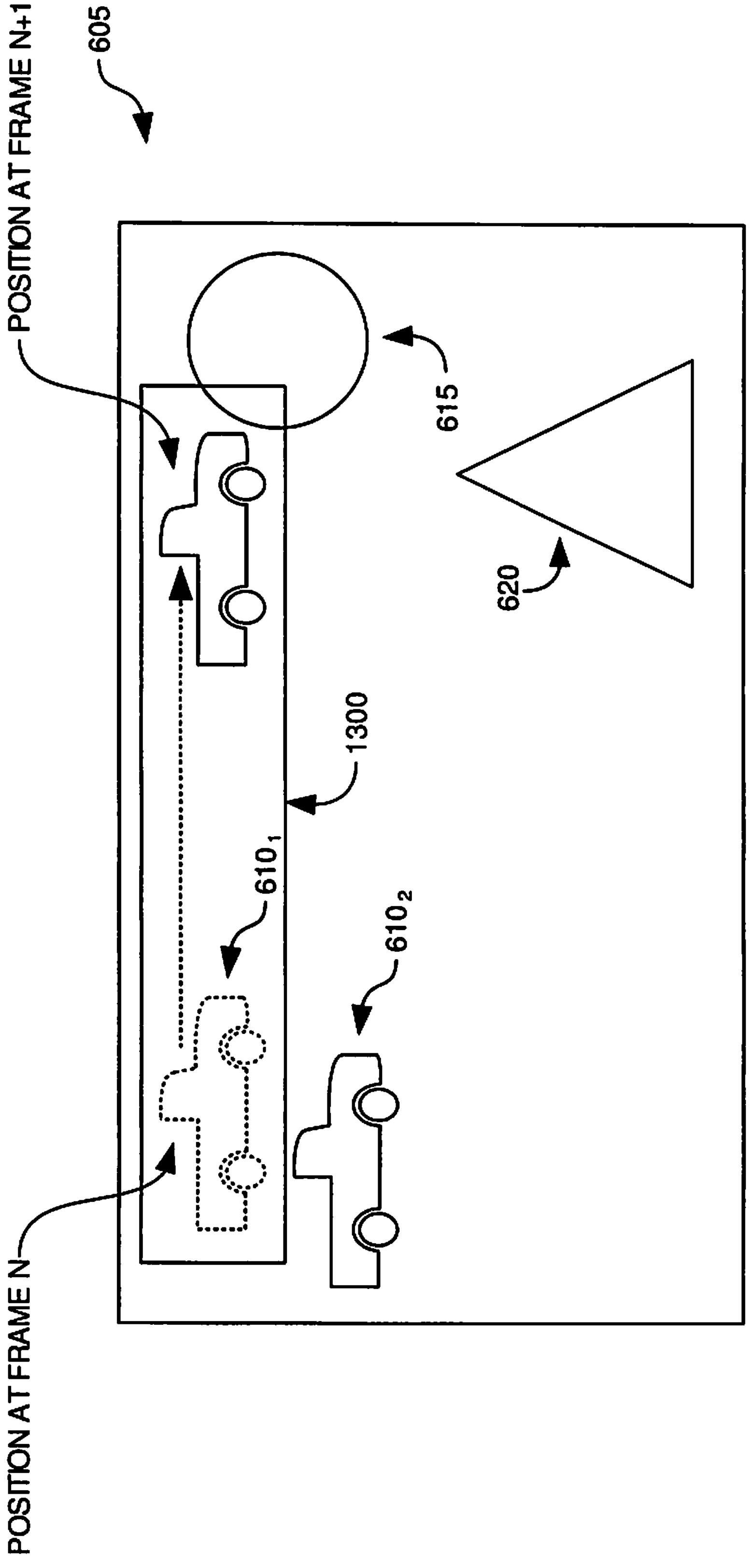

FIG. 13 illustrates an exemplary velocity box 1300 which encloses the moving first car object 610$_1$. As illustrated the velocity box 1300 may be a simple rectangular box the dimensions of which are based on the dimensions of the moving object and the distance the moving object may move over the period of time under evaluation. The evaluation time period may be the period of a frame, or may be shorter and iterated many times for a single frame to prevent adverse effects (e.g. tunneling).

The velocity box may also be a more complex shape (e.g., a cylinder) which better reflects the path of the object from its initial position to its final position. A more complex shape may further reduce the number of objects which may collide with the velocity box. The complexity of the shape of the velocity box created by the physics engine may ultimately depend on a balance between the processing time necessary for the physics engine to create a more complex velocity box and the number of collision tests which may be reduced by creating a more complex velocity box.

After creating the velocity box 1300 the physics engine may perform intersection tests with the velocity box 1300 and objects within the three-dimensional scene 605. For example, intersection tests may be performed with the velocity box 1300 and the second car object 610$_2$, the velocity box 1300 and the circle object 615, and the velocity box 1300 and the triangle object 620. As a result of performing these intersection tests, the physics engine may determine that the velocity box 1300 intersects the circle object 615 (the intersection of the velocity box 1300 and the circle object 615 is illustrated in FIG. 13). Thus, a collision between the first car object 610$_1$ and the circle object 615 may be likely. Consequently, the physics engine may only need to perform a single collision detection test (i.e., with the first car object 610$_1$ and the circle object 615).

By determining which objects are likely to intersect the moving first car object 610$_1$ the physics engine was able to reduce the number of collision tests from three tests to one test. Although testing objects within the three-dimensional scene for intersections with the velocity box may add to the total number tests which may need to be performed from three tests to four tests (i.e., one collision test plus three intersection tests), the increase in tests will be less computationally expensive and consume less time than executing three collision tests. Therefore, the overall result may be a reduction in the time necessary to determine if the moving object collides with any other objects.

Box Casting Using an Integrated Acceleration Data Structure

Although intersection tests with a velocity box may reduce the number of collision tests which may need to be performed by the physics engine, the physics engine may still need to perform intersection tests with the velocity box and each object within the three-dimensional scene in order to determine which objects are likely to collide with the moving object. In a complicated three-dimensional scene containing many objects, this may result in a large number of intersection tests which may need to be performed to determine which collisions with the moving object are likely.

However, according to one embodiment of the invention, a physics engine may use the spatial information stored in the integrated acceleration data structure to determine which objects within the three-dimensional scene are within the same area as the velocity box and thus are likely to intersect the velocity box. Similar to how an image processing system may cast a ray into a three-dimensional scene and traverse the integrated acceleration data structure to determine objects which are intersected by the ray, according to embodiments of the invention, the physics engine may cast a velocity box into the three-dimensional scene and traverse the velocity box (based on the dimensions and location of the velocity box) through the integrated acceleration data structure to determine which bounding volumes the velocity box intersects (i.e., a portion of the velocity box exists within a bounding volume). The physics engine may then perform intersection tests with objects within the intersected bounding volumes (i.e., objects which are in the same area as the velocity box) which are more likely to intersect the velocity box.

Conversely, objects which are in bounding volumes which are not intersected by the velocity box may be excluded by the physics engine when performing intersection tests, because they are not in the same area as the velocity box and thus will not intersect the velocity box. Therefore, in contrast to a physics engine performing intersection tests with the velocity box and every other object within the three-dimensional scene, the physics engine may perform intersection tests with objects which are in the same bounding volumes and thus the same area as the velocity box. Consequently, the physics engine may reduce the number of intersection tests which may need to be performed.

Figure 14:
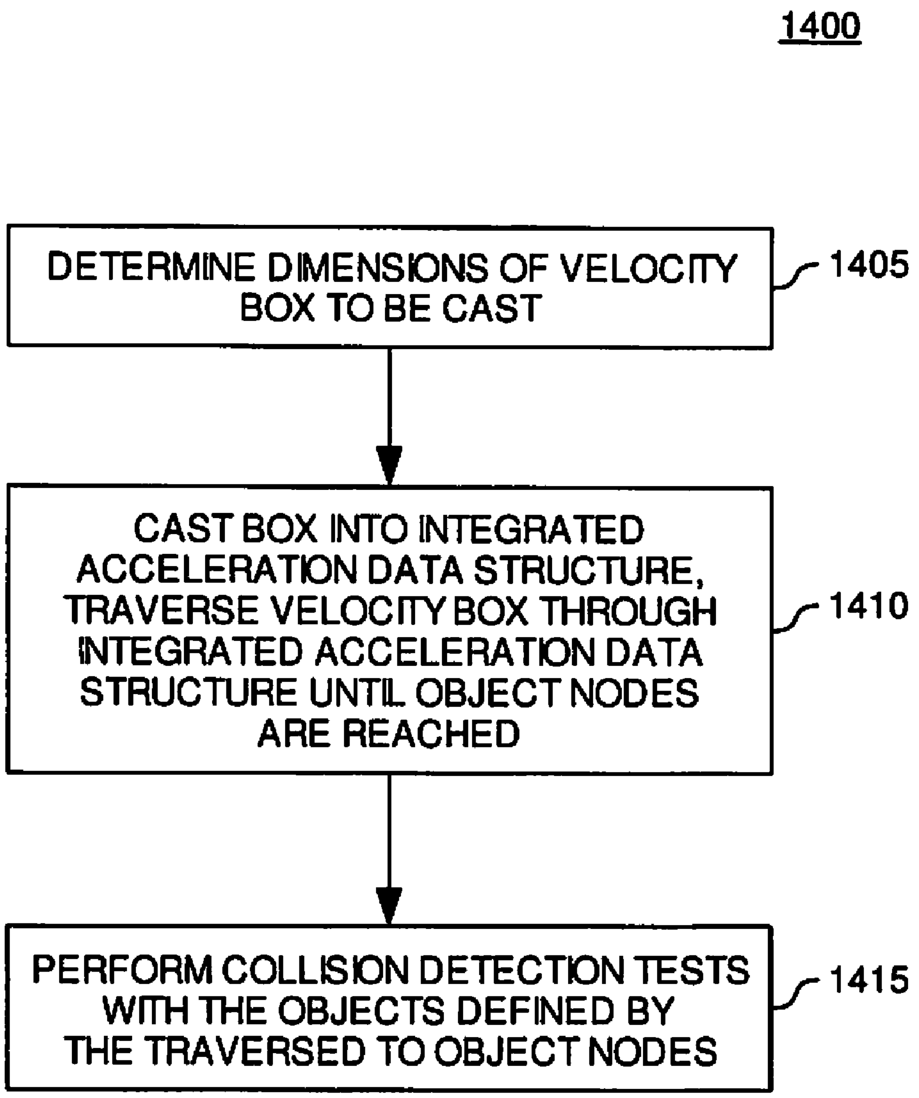
FIG. 14 is a flowchart illustrating an exemplary method of performing box casting, according to one embodiment of the invention.

FIG. 14 illustrates a method 1400 of casting a velocity box into an integrated acceleration data structure, according to one embodiment of the invention. The method 1400 may begin, for example, when a physics engine determines that an object will move within the three-dimensional scene. Initially, at step 1405, the physics engine may determine the dimensions of the velocity box to be cast into the three-dimensional scene.

As mentioned above, the dimensions of the velocity box may be determined based on the dimensions of the moving object and the amount of distance the moving object may travel over the time period under evaluation (e.g., a single frame). The dimensions of the velocity box should be such that it encompasses the moving object over the entire path of movement being evaluated. For example, the velocity box 1300 in FIG. 13 encompasses the first car object $\mathbf{610}_1$ in both its first position and its second position (i.e., the amount of distance the first car object traveled). According to embodiments of the invention, the velocity box may be created such that is an axis-aligned velocity box (i.e., sides which are parallel or perpendicular to the axes which are used to create the spatial index) or may be created such that it is not axis-aligned (i.e., sides of the velocity box not parallel or perpendicular to the axes which are used to create the spatial index). However, an axis-aligned velocity box may be easier to traverse through the integrated acceleration data structure.

Next, at step 1410, the velocity box may be cast into the integrated acceleration data structure and traversed through the integrated acceleration data structure. This may entail testing bounding volumes defined by the nodes in the integrated acceleration data structure to determine if a portion of (or the entire) velocity box intersects or is within a bounding volume defined by a node. The physics engine may begin traversing the velocity box through the integrated acceleration data structure at the world node.

If a portion of the velocity box is located within the bounding volume defined by the world node, the physics engine may take the branches to the nodes beneath the world node. The nodes beneath the world nodes may define bounding volumes which are created by a splitting plane through the bounding volume defined by the world node (e.g., an axis-aligned splitting plane). The physics engine may determine if the velocity box, or a portion of the velocity box, is within the bounding volumes defined by the nodes below the world node. If so, the physics engine may take the branches from the nodes below the world node to nodes beneath or on a lower level of the integrated acceleration data structure. The bounding volume intersection tests and taking branches to nodes beneath nodes which defines bounding volumes intersected by the velocity box may continue until an object node is reached or a node is reached which does not contain a portion of the velocity box. The objects which are defined by the object nodes which are traversed to may be placed into a set of objects to be used later in intersection tests with the velocity box.

Figure 15:
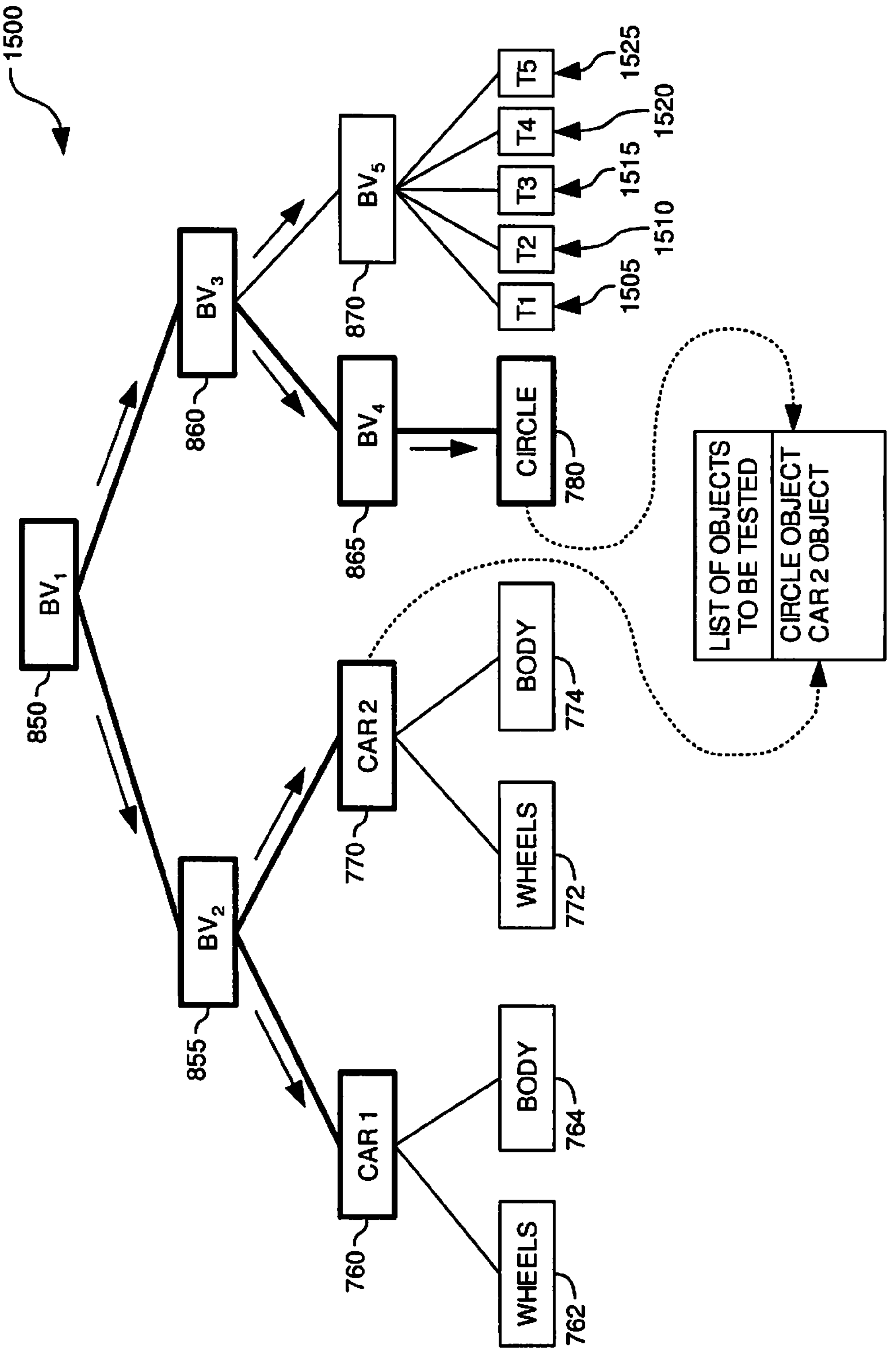
Figure 16:
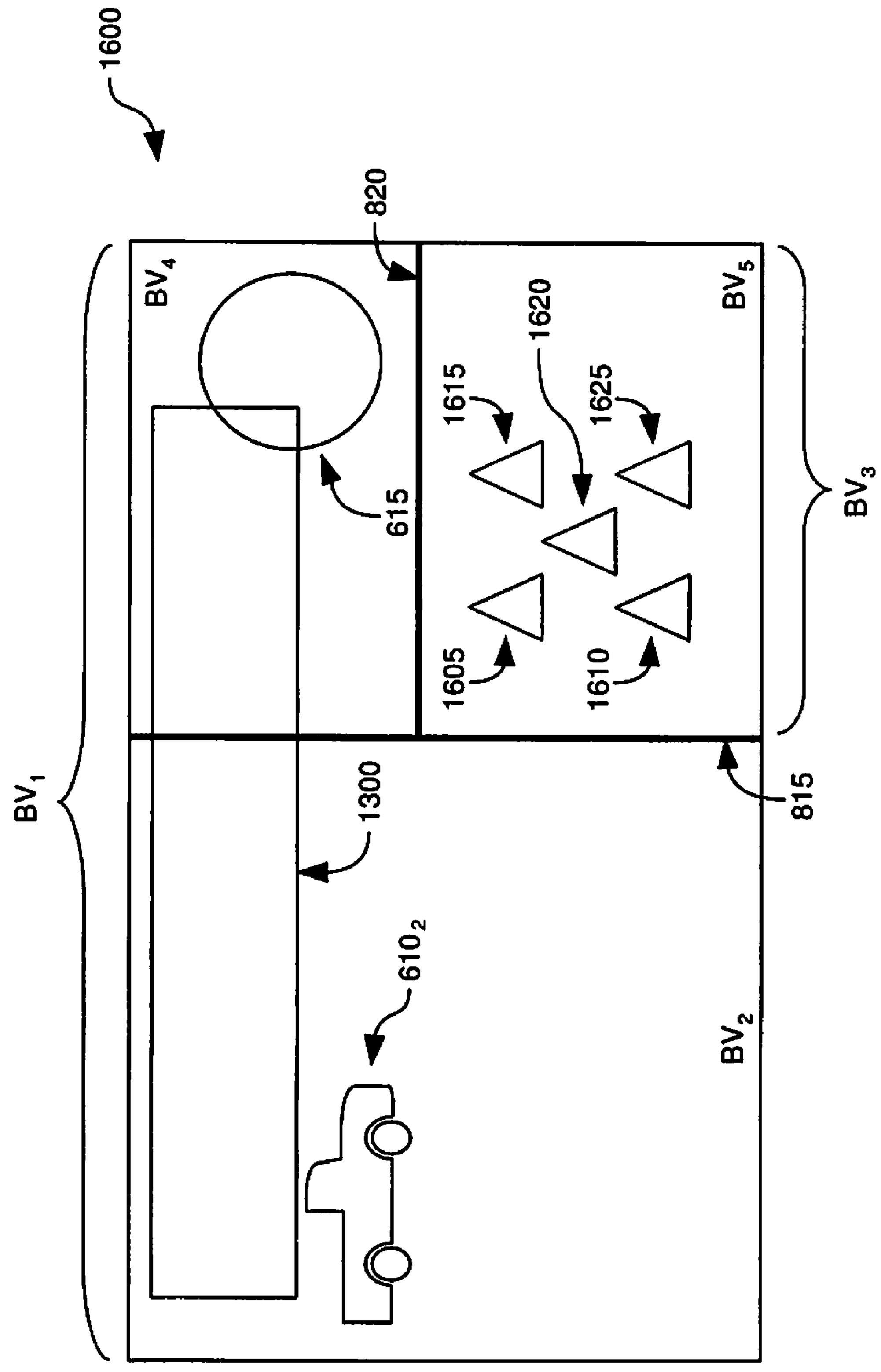

For example, FIG. 15 illustrates an integrated acceleration data structure 1500 which corresponds to a three-dimensional scene 1600 illustrated in FIG. 16. The integrated acceleration data structure contains nodes which define bounding volumes (e.g., $BV_1$-$BV_5$) within the three-dimensional scene 1600. The integrated acceleration data structure 1500 is similar to the earlier described integrated acceleration data structure 900 of FIG. 9 with the exception of several object nodes (i.e., object node 1505, object node 1510, object node 1515, and object node 1520) which correspond to objects located within a bounding volume (i.e., $BV_5$) of the three-dimensional scene 1600.

The physics engine may begin traversing the velocity box 1300 (illustrated in FIG. 1600) through the integrated acceleration data structure 1500 by determining if the velocity box 1300 is within or intersects the bounding volume defined by the world node 850 (i.e., $BV_1$). As can be seen in FIG. 16, the velocity box 1300 is within the bounding volume defined by the world node 850 (i.e., $BV_1$), and therefore the results of the physics engine's determination will indicate the intersection. An intersection of the velocity box 1300 with a bounding volume defined by nodes (e.g., world node 850) in the integrated acceleration data structure 1500 is illustrated in FIG. 15 by the darkened outline of the nodes (e.g., the darkened outline of the world node 850).

Next, the physics engine may continue to traverse the integrated acceleration data structure 1500 by taking the branches from the world node 850 to the nodes beneath the world node 850 (i.e., node 855 and node 860). The physics engine may then perform tests to determine if the velocity box 1300 intersects or is within the bounding volumes defined by the nodes beneath the world node 850 (i.e., $BV_2$ and $BV_3$). The physics engine may determine from these tests that the velocity box 1300 is within or intersects the bounding volumes defined by the nodes beneath the world node 850 (i.e., the velocity box 1300 intersects both $BV_2$ and $BV_3$). The physics engine may then continue traversing the integrated acceleration data structure 1500 by taking the branches from the intersected nodes to the nodes beneath the intersected nodes.

As illustrated in FIG. 15, the physics engine may take a branch from node 855 (defining bounding volume $BV_2$) to the first car object node 760 and another branch from node 855 to the second car object node 770. Consequently, the second car object $\mathbf{610}_2$ is in the same areas as the velocity box 1300, and is likely to intersect the velocity box 1300. Therefore, the physics engine may add the second car object $\mathbf{610}_2$ to a list of objects which may be used later in intersection tests to determine which objects intersect the velocity box 1300. While the first car object $\mathbf{610}_1$ may be within the same area as the velocity box 1300, the first car object $\mathbf{610}_1$ may be excluded from the intersection tests by the physics engine because the first car object is the moving object.

The physics engine may also take the branches from node 860 (defining bounding volume $BV_3$) to nodes beneath node 860 (i.e., node 865 and node 870). Both node 865 and node 870 define bounding volumes (i.e., $BV_4$ and $BV_5$), not object nodes. Therefore, the physics engine may perform tests to determine if the velocity box is within or intersects the bounding volumes defined by node 865 and node 870. As can be see in FIG. 16, part of the velocity box 1300 is within $BV_4$ but no portion of velocity box 1300 is within $BV_5$. Therefore, the results of the intersection tests may indicate that a portion of the velocity box is within the bounding volume defined by node 865 (i.e., $BV_4$), but that no portion of the velocity box is within the bounding volume defined by node 870 (i.e., $BV_5$). The intersection with $BV_4$ and not $BV_5$ is illustrated in FIG. 15 by the darkened outline of node 865 which corresponds to $BV_4$, but no darkened outline of node 870 corresponding to $BV_5$. Consequently, the physics engine may take branches from node 865 but not from node 870. As illustrated in FIG. 15, the branch from node 865 leads to the object node 780 which corresponds to the circle object 615 contained within bounding volume $BV_4$. Consequently, the circle object 615 may be in the same area of the velocity box 1300 and thus is likely to intersect the velocity box 1300. Therefore, the physics engine may add the circle object 615 to a list of objects which may be later used intersection tests to determine which objects intersect with the velocity box 1300. However, the physics engine may not use the objects located within $BV_5$ (i.e., triangle objects 1605-1625) and branched to from node 870 because those objects are not in the same area as the velocity box.

After the physics engine has finished traversing the velocity box through the integrated acceleration data structure, the physics engine may proceed to step 1415 of method 1400 to perform intersection tests with the list of objects which are defined by the traversed to objects nodes in the integrated acceleration data structure. The results of these intersection tests indicate which objects intersect with the velocity box and therefore are likely to collide with the moving object. The physics engine may use those objects when performing collision tests with the moving object. The results of the collision tests may indicate which objects actually collide with the moving object. Consequently, the physics engine may calculate new positions of the moving object and the objects which intersect the moving object and store the new positions, for example, within the integrated acceleration data structure. The image processing system may use the updated integrated acceleration data structure to render a two-dimensional image using the new positions of the objects in the three-dimensional scene.

For example, as was determined by traversing velocity box 1300 through the integrated acceleration data structure 1500, the physics engine may perform intersection tests with the second car object $610_2$ and the circle object 615 which were contained within the traversed to bounding volumes (i.e., $BV_2$ and $BV_4$, respectively). The intersection tests may determine that only the circle object 615 intersects the velocity box 1300. Consequently, the physics engine may perform a collision test with the moving object (i.e., the first car object 6101) and the circle object 615. In contrast to a physics engine which does not cast the velocity box into the three-dimensional scene and traverse the velocity box through the three-dimensional scene, the physics engine may reduce the number of velocity box/object intersection tests by five. The reduction in five intersection tests is due to the physics engine not performing intersection tests with the five triangle objects (i.e., triangle objects 1605-1625) which are contained within the bounding volume which was not intersected by the velocity box (i.e., $BV_5$). In comparison a physics engine which does not traverse the velocity box through an integrated acceleration data structure, rather merely performs intersection tests with the velocity box and every other object within the three-dimensional scene will execute intersection tests with the velocity box and the triangle objects (i.e., triangle objects 1605-1625).

Although, in the present example, the reduction in calculations is relatively small, in a three-dimensional scene containing many objects, casting a velocity box into the scene and traversing the velocity box through the integrated acceleration data structure to determine which objects may be used in collision tests may result in a substantial reduction in calculations. Consequently, the processing time required to perform physics simulation may be substantially reduced.

In addition to reducing the number of objects which may need to be tested against to determine if the moving object collides with other objects, box casting may be used to parallelize physics calculations in a multi-processor environment. For example, a physics engine may use box casting to parallelize collision detection in the multiple-core processing element 100 or in the network of multiple-core processing elements 200.

According to one embodiment of the invention, a physics engine may parallelize collision detection by box casting to determine which objects a moving object is likely to collide, and then using separate processing elements to determine if the moving object collides with any of the objects which are likely to collide with the moving object. The separate processing elements may perform intersection tests and collision detection tests to determine if the moving object collides with any of the objects which are likely to collide with the moving object.

For example, a physics engine may use box casting to determine that two objects are likely to intersect a moving object. The physics engine may then use a thread of a first processing element (e.g., a BTE 105) to execute intersection tests and collision tests to determine if the moving object collides with a first of the two objects, and a thread of a second processing element (e.g., a BTE 105) to execute intersection tests and collision tests to determine if the moving object collides with a second of the two objects. Thus, the physics engine may parallelize collision detection by using box casting and two separate processing elements.

Sound Engine

A sound engine may be used in combination with a game engine or game system to simulate sound within a three-dimensional scene. The sound engine may also be used to modify sound effects depending on various factors occurring within a three-dimensional scene or aspects or properties of the three-dimensional scene. For example, the sound engine may add echoes, dampening, or Doppler effects to sounds which are created or encountered within a three-dimensional scene. For example, an explosion may occur within a confined space within the three-dimensional scene. A character also within the same confined space may hear the initial blast and may also hear echoes which accompany the initial blast and are created by aspects of the confined space.

Figure 17:
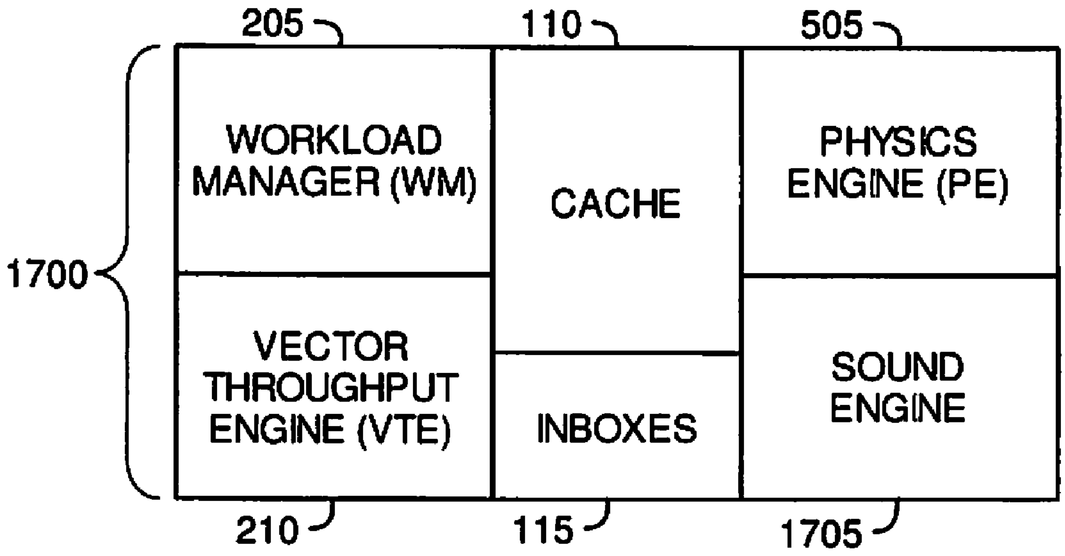

A sound engine may be constructed of various software and hardware components in a computer or game system. According to one embodiment of the invention, a sound engine may use multiple threads on a multiple core processing element to simulate sounds within a three-dimensional scene. For example, FIG. 17 illustrates a multiple core processing element 1700 wherein the threads of one of the processing elements (cores) are allocated to a sound engine 1705. Other cores within the multiple-core processing element may perform image processing related tasks and physics related tasks, according to embodiments of the invention. For example, one core within the multiple-core processing element 1700 may be allocated to a workload manager 205, another allocated to vector throughput engine 210, and another core allocated to a physics engine 505 according to one embodiment of the invention.

The multiple-core processing element 1700 may have a memory cache 110 shared between all of the cores located on the multiple-core processing element 100. Furthermore, each core may have its own cache (e.g., an L1 cache). The multiple-core processing element 100 may also contain inboxes 115. The inboxes 115 may be memory mapped address space used by the cores as a communications network.

Using Ray Tracing for Real Time Audio Synthesis

As described above, a sound engine may be used in a game system, for example, to simulate sounds or generate sound effects within a three-dimensional scene. According to embodiments of the invention, ray tracing may be used by a sound engine to emulate sound waves propagating from sound events which occur within the three-dimensional scene. By emulating sound waves using rays, a sound engine may effectively simulate sound within the three-dimensional scene. In contrast to calculating the propagation of sound waves, by emulating sound waves using rays and ray tracing, a sound engine may simulate sound using less processing power and, consequently, may accurately simulate sound in real time.

Figure 18:
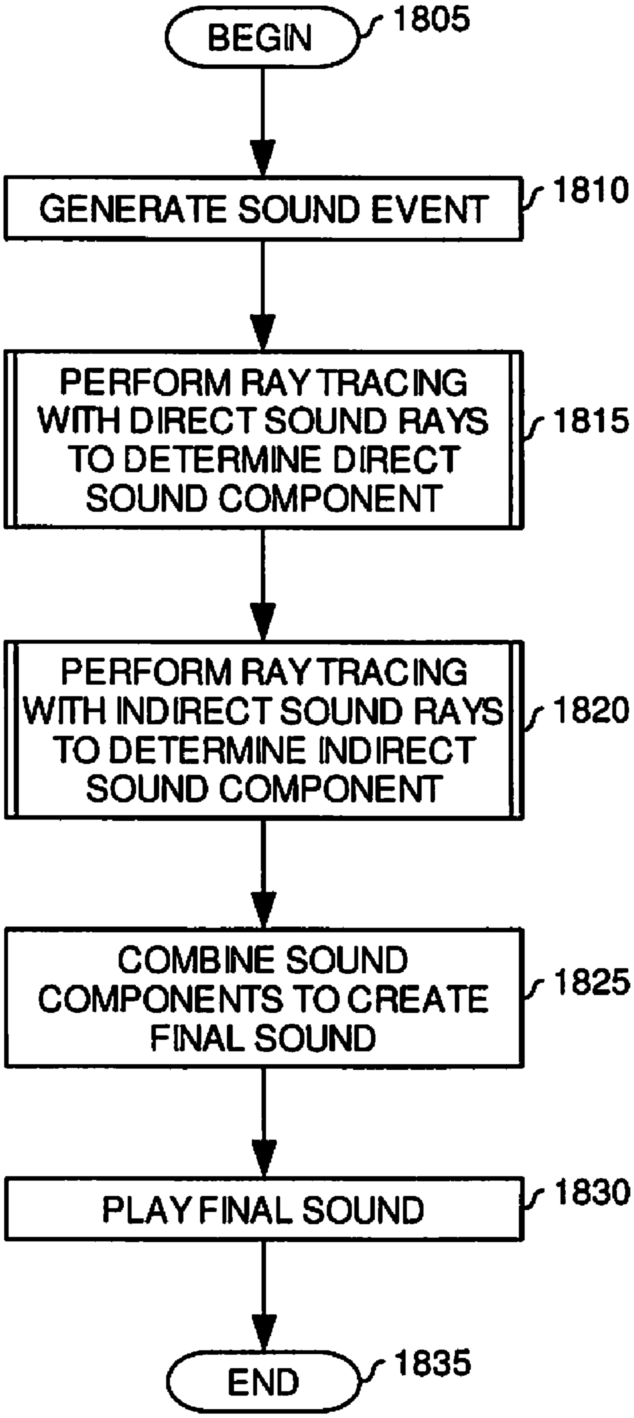
FIG. 18 is a flowchart illustrating an exemplary method using ray tracing to emulate sound waves within a three-dimensional scene, according to one embodiment of the invention.

FIG. 18 is a flowchart which illustrates an exemplary method 1800 of using ray tracing to emulate sound waves within a three-dimensional scene, according to one embodiment of the invention. The method 1800 begins at step 1805. Next, at step 1810, the sound engine may generate a sound event at a location within a three-dimensional scene. A sound event may be a pre-recorded or artificially created sound which may be used to simulate a real world occurrence. For example, a sound event may be an explosion and may have been created by recording an actual explosion or artificially creating a recording which emulates a real world explosion.

Figure 19:
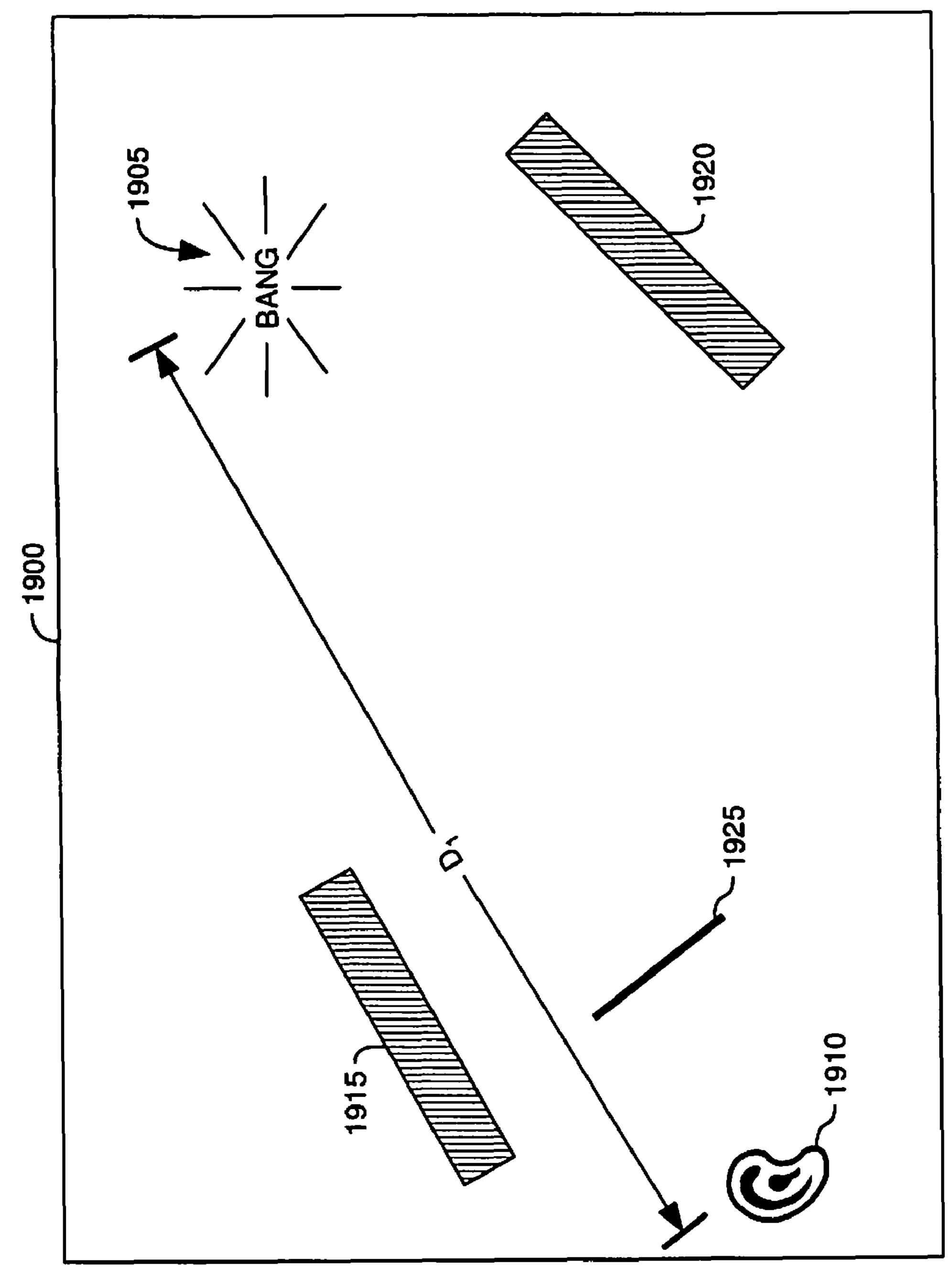
FIGS. 19-21, 23, 25, and 26 illustrate an exemplary sound event occurring within a three-dimensional scene, according to one embodiment of the invention.

FIG. 19 illustrates an exemplary three-dimensional scene 1900 within which a sound event 1905 may be generated by a sound engine. As illustrated, the sound event 1905 occurs at a location some distance ($d_1$) from a listener 1910. Also illustrated in FIG. 19 are objects within the three-dimensional scene 1900. For example, a first wall object 1915, a second wall object 1920 and a window object 1925 are illustrated within the three-dimensional scene 1900.

After generating the sound event, the sound engine may proceed to step 1815 where the sound engine may perform ray tracing with direct sound rays to determine a direct sound component of the final sound heard at the listener location. As described further below with regards to FIG. 22, performing ray tracing with direct sound rays may include issuing a direct sound ray or rays and performing ray tracing with the direct sound ray to emulate sound waves which may, in a real environment, propagate from the sound event location towards the listener location.

Figure 20:
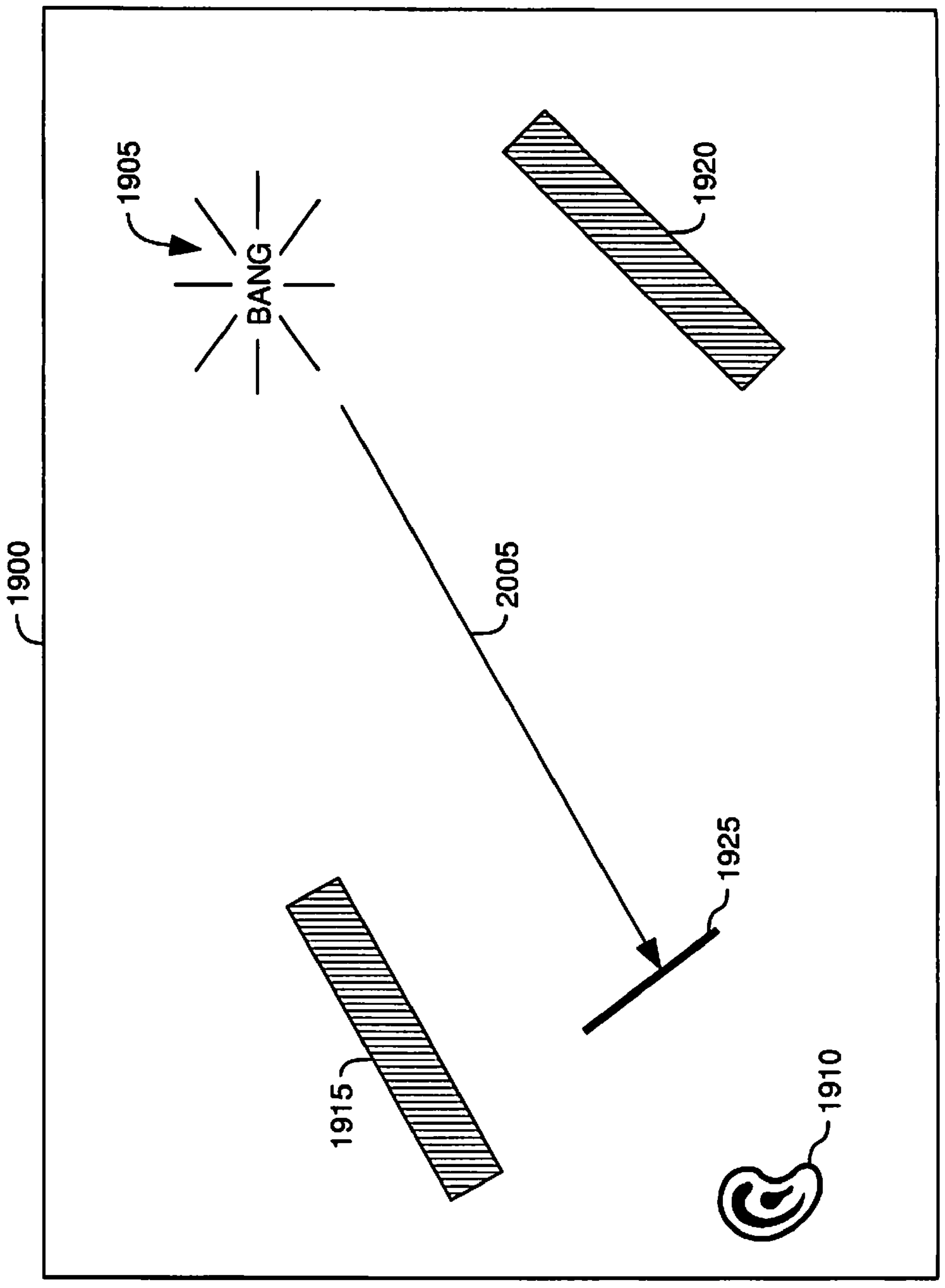

FIG. 20 illustrates a direct sound ray 2005 which has a trajectory directed from the sound event 1905 location towards the listener 1910 location. As described further below with respect to FIG. 22, if the direct sound ray intersects an object or objects within the three-dimensional scene, the sound engine may determine a sound modification factor associated with the intersected objects (e.g., dampening, amplification, change in direction, etc.). The sound modification factor may be applied to the sound event, along with other factors determined when performing ray tracing with the direct ray (e.g., distance traveled, etc.) to produce a direct sound component which may later be used (e.g., in step 1825 of method 1800) or combined with other sound components to determine a final sound heard at the listener 1910 location.

Next, at step 1820, the sound engine may perform ray tracing with indirect sound rays to determine an indirect sound component of the final sound heard at the listener location. As described further below with regards to FIG. 24, performing ray tracing with the indirect sound rays may include issuing a plurality of indirect sound rays into the three-dimensional scene and performing ray tracing with the plurality of indirect sound rays to emulate sound waves which, in a real environment, bounce off of objects and eventually reach the listener 1910 location. The sound engine may perform ray tracing with the plurality of indirect sound rays to determine if they intersect an object or objects within the three-dimensional scene. The indirect sound rays may originate from the sound event location 1905 and may have various trajectories into the three-dimensional scene which differ from the trajectory of the direct sound ray.

Figure 21:
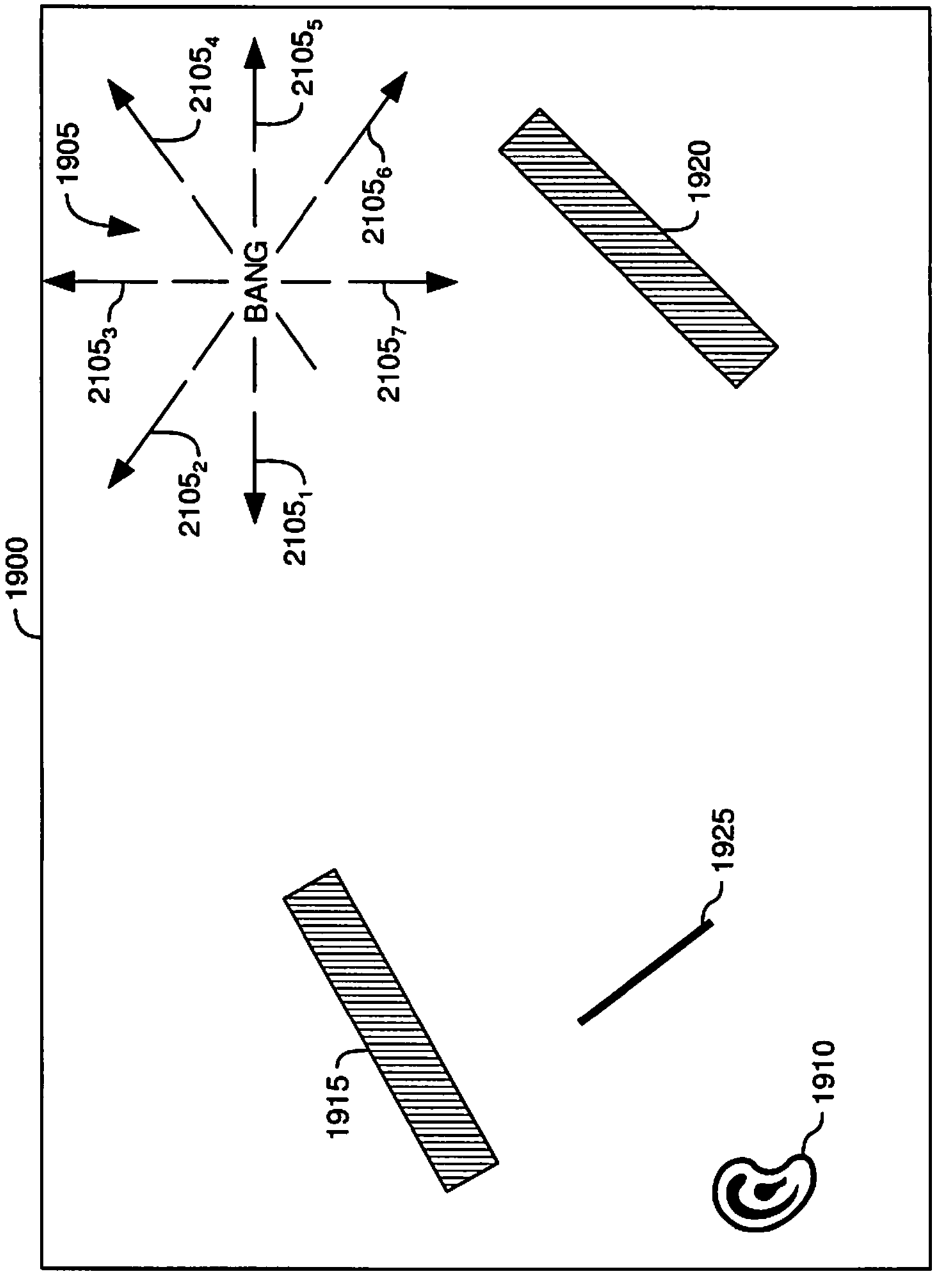

FIG. 21 illustrates a plurality of indirect sound rays $\mathbf{2105}_1$-$\mathbf{2105}_7$. As illustrated in FIG. 21, the plurality of indirect sound rays $\mathbf{2105}_1$-$\mathbf{2105}_7$ have trajectories directed away from the sound event 1905 location and into the three-dimensional scene 1900. If an indirect sound ray does not intersect any objects within the three-dimensional scene, the indirect sound ray may never reach the listener and, thus, may not contribute to the final sound heard at the listener location. However, if an indirect sound ray intersects an object within the three-dimensional scene, the indirect sound wave may (via a reflection off of the object) reach the listener and, thus, may contribute to the final sound heard at the listener location.

Therefore, according to embodiments of the invention, if the indirect sound rays intersect objects within the three-dimensional scene, the sound engine may determine a sound modification factor associated with the intersect object. After determining a sound modification factor, the sound engine may then issue a new indirect ray from the point an indirect ray intersected an object within the three-dimensional scene. The new indirect ray may have a trajectory directed towards the listener location, and the sound engine may perform ray tracing with the new indirect sound ray to determine if it reaches the listener location or intersects objects within the three-dimensional scene. Based on the results of performing ray tracing with the indirect rays, the new indirect rays, and other factors (e.g., sound modification factors, distance traveled by the indirect rays and new indirect rays, etc.) the sound engine may determine an indirect sound component which may be used (e.g., in conjunction with the direct sound component) to determine a final sound heard at the listener location.

After the sound engine has finished performing ray tracing with the direct sound rays and the indirect sound rays, the sound engine may proceed to step 1825 to determine a final sound by combining the direct sound component and the indirect sound component(s). Next, at step 1830, the sound engine may play the final sound. For example, the sound engine may play the final sound by generating an output signal (or signals) to an integrated circuit(s) or a soundcard which may be configured to generate or send a signal to speakers attached to the video game system. After playing the final sound, the sound engine may proceed to step 1835 to end the method.

Figure 22:
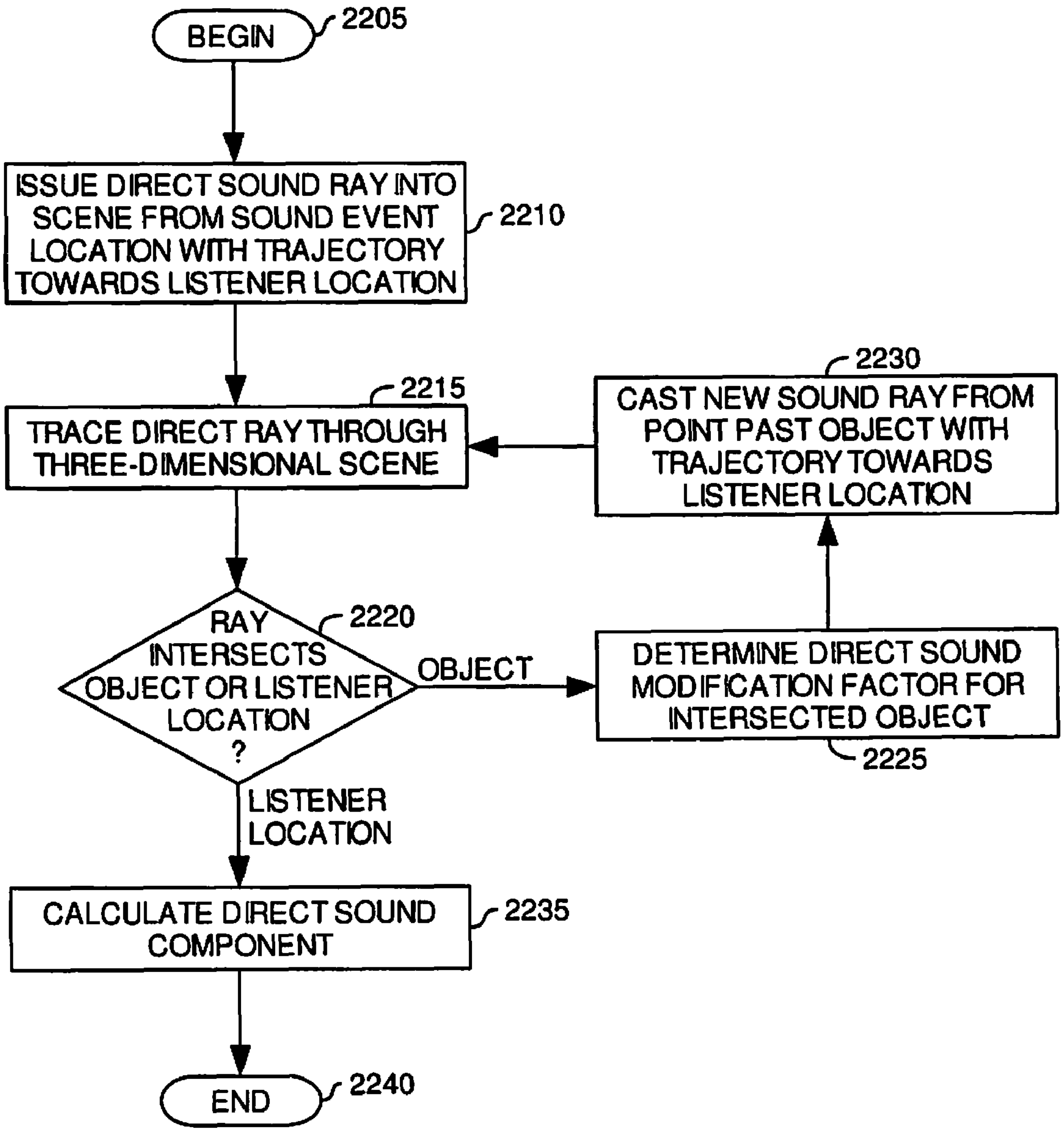
FIG. 22 is a flowchart which illustrates an exemplary method of issuing a direct sound ray into a three-dimensional scene and performing ray tracing with the direct sound ray, according to one embodiment of the invention.

As described above with respect to step 1815, the sound engine may issue a direct sound ray into the three-dimensional scene and perform ray tracing with the direct sound ray to determine a direct sound component. FIG. 22 is a flowchart which illustrates an exemplary method 2200 of issuing a direct sound ray into the three-dimensional scene and performing ray tracing with the direct sound ray, according to one embodiment of the invention. The method begins at step 2205, for example, when step 1815 of method 1800 is executed by the sound engine. Next, at step 2210 the sound engine may issued the direct ray into the three-dimensional scene. The sound engine may issue the direct ray into the scene such that it begins at the location of the sound event and has a trajectory directed towards the location of the listener.

Although described and illustrated herein as the sound engine issuing a single direct sound ray into the three-dimensional scene, embodiments of the invention may issue a plurality of direct sound rays into the three-dimensional scene. For example, two direct sound rays may be issued into the three-dimensional scene to determine a stereophonic final sound to be heard by the listener at the listener location.

After issuing the direct sound ray into the three-dimensional scene, at step 2215, the sound engine may perform ray tracing with the direct sound ray. The sound engine may perform ray tracing with the direct sound ray similar to how an image processing system may perform ray tracing as described above with respect to FIG. 4. That is, the sound engine may use a spatial index to trace the sound ray through the three-dimensional scene. The spatial index may contain nodes corresponding to bounding volumes which partition the three-dimensional scene. The sound engine may take branches to nodes in the spatial index which correspond to bounding volumes intersected by the sound ray. The sound engine may take branches to nodes until a leaf node containing primitives is reached, or in the case of a combined spatial index, until an object node is reached. Once an object node or leaf node is reached, the sound engine may perform ray-primitive or ray-object intersection tests to determine if a sound ray intersects a primitive or an object within the three-dimensional scene.

The three-dimensional scene may have been partitioned by the image processing system or some other system based on object locations prior to the sound engine commencing the sound wave emulation method 1800. For example, the physics engine or the image processing system may have created the spatial index for physics simulation purposes or image processing purposes, respectively. Those systems may have stored the spatial index in a location accessible by the sound engine (e.g., memory cache 110). Consequently, the sound engine may use the same spatial index (acceleration data structure or combined spatial index) which was created for or by the image processing system to perform ray tracing with direct and indirect sound rays. In contrast to creating an entirely new data structure to partition the three-dimensional scene specifically for tracing sound rays through the scene, the sound engine may reduce the amount of space required to store a data structure to be used when emulating sound waves by using the spatial index created by the physics engine or the image processing system.

As the direct sound ray is being traced through the spatial index, or after the direct sound ray has been traced through the spatial index, at step 2220 the sound engine may determine if the direct sound ray intersected an object or intersected the listener location. If the direct sound ray intersected an object within the three-dimensional scene, the sound engine may proceed to step 2025 to determine a direct ray sound modification factor for the intersected object. The direct ray sound modification factor for the intersection object may be a predetermined value based on properties of the object which may define the amount of sound which may pass through or transmit through the intersected object. For example, if the object is a dense material and relatively thick (e.g., piece of metal, brick wall, etc.) the object may have a direct ray sound modification factor which will decrease or modify the volume of the sound (amplitude of a sound wave) by a relatively large amount. In contrast, if the object is a porous or thin material (e.g., wire screen, paper, etc.) the object may have a direct ray sound modification factor which will decrease or modify the volume of the sound event by a relatively small amount. In addition to modifying the amplitude or volume of a sound, the direct ray sound modification factor associated with an object may also modify the pitch or frequency of the sound.

Regardless of the value of a sound modification factor for the intersected object, according to embodiments of the invention, a sound modification factor (or factors) may be stored along with other attributes of an object. For example, a primitive which makes up a portion of the object may have factors such as a reflectivity value for light and a refractivity value for light used by the image processing system when performing ray tracing to render a two-dimensional image of the three-dimensional scene. According to embodiments of the invention, a sound modification factor or factors may be stored along with other information which defines the primitive (e.g., along with the image processing related values). This information may be stored, for example, within the spatial index (e.g., integrated acceleration data structure, kd-tree, etc.). By storing sound modification factors with other attributes of objects within the three-dimensional scene, the sound engine may use ray tracing techniques similar to an image processing system when performing ray tracing with the sound rays.

According to one embodiment of the invention, after determining a sound modification factor for the sound ray and the intersected object, the sound engine may proceed to step 2030 where the sound engine may cast a new sound ray into the three-dimensional scene due to the intersection of the sound ray and the object. According to one embodiment of the invention, after an intersection of a direct sound ray and an object, the sound engine may cast a new direct sound ray into the three-dimensional scene which originates from a point past the intersected object. Furthermore, the new direct sound ray may have a trajectory directed towards the listener location. By casting a new direct sound ray into the three-dimensional scene with a trajectory directed towards the listener location, the sound engine may quickly determine if a sound wave (whose path is emulated by the sound ray) reaches the listener.

After issuing the new sound ray into the three-dimensional scene, the sound engine may return to step 2215 to perform ray tracing with the new sound ray. The new direct sound ray may emulate a portion of a sound wave which may pass though or be transmitted through the object in a real world three-dimensional scene as described above. The operations of method 2200 may be repeated, for example, until some specified level of recursion has been reached.

Figure 23:
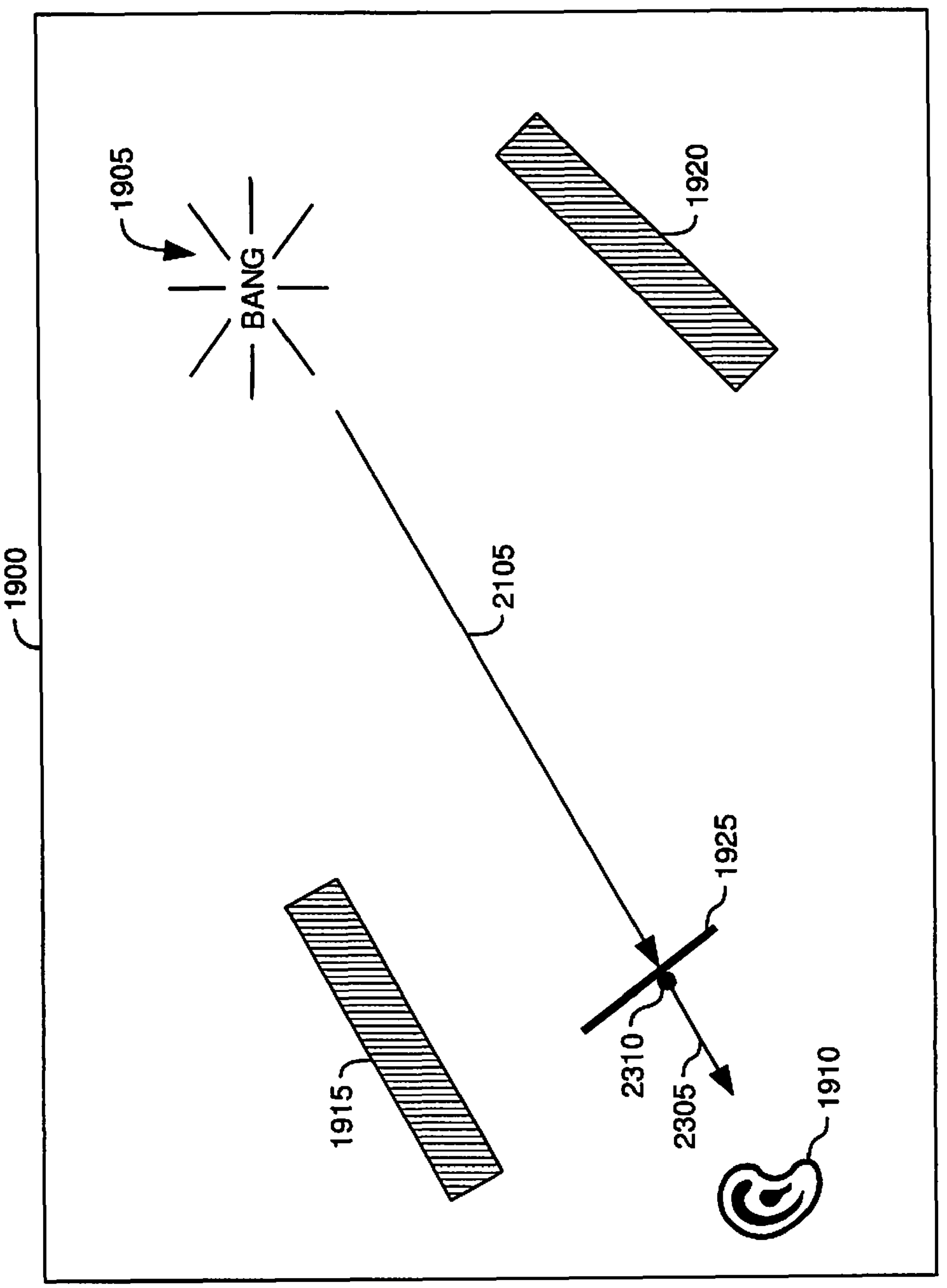

FIG. 23 illustrates the exemplary three-dimensional scene 1900 described above with respect to FIG. 19. However, FIG. 23 also illustrates the direct sound ray 2105 intersecting the window object 1925. According to embodiments of the invention, the sound engine may determine that the direct sound ray 2105 intersects the window object 1925 in step 2220, and may proceed to step 2225 to determine a sound modification factor for the intersected object. The sound engine may determine the sound modification factor, for example, by searching a memory location within the memory space where the spatial index associated with the window object (e.g., memory cache 110).

After determining the sound modification factor for the window object at step 2225, the sound engine may cast a new direct sound ray generated based on the ray 2105 and the sound modification factor into the three-dimensional scene 1900 in step 2230. For example, FIG. 23 illustrates the new direct sound ray 2305 which originates from a point 2310 past the intersected window object 1925, and has a trajectory directed towards the listener 1910 location. The sound engine may perform ray tracing with the new direct sound ray 2305, and may determine that the new direct sound ray 2305 intersects the listener 1910 location.

According to one embodiment of the invention, after the sound engine determines that the direct sound ray intersects the listener location, the sound engine may proceed to step 2235 to calculate a direct sound component. The calculation of the direct sound component, for example, may take into consideration the objects intersected by the direct ray and direct ray sound modification factors associated with the intersected objects, and may take into consideration the distance traveled by the direct sound ray and any new direct sound rays. These factors may be applied to the original prerecorded sound or sound event to determine a direct sound component. After calculating the direct sound component, the sound engine may proceed to step 2240 to end the method 2200.

Figure 24:
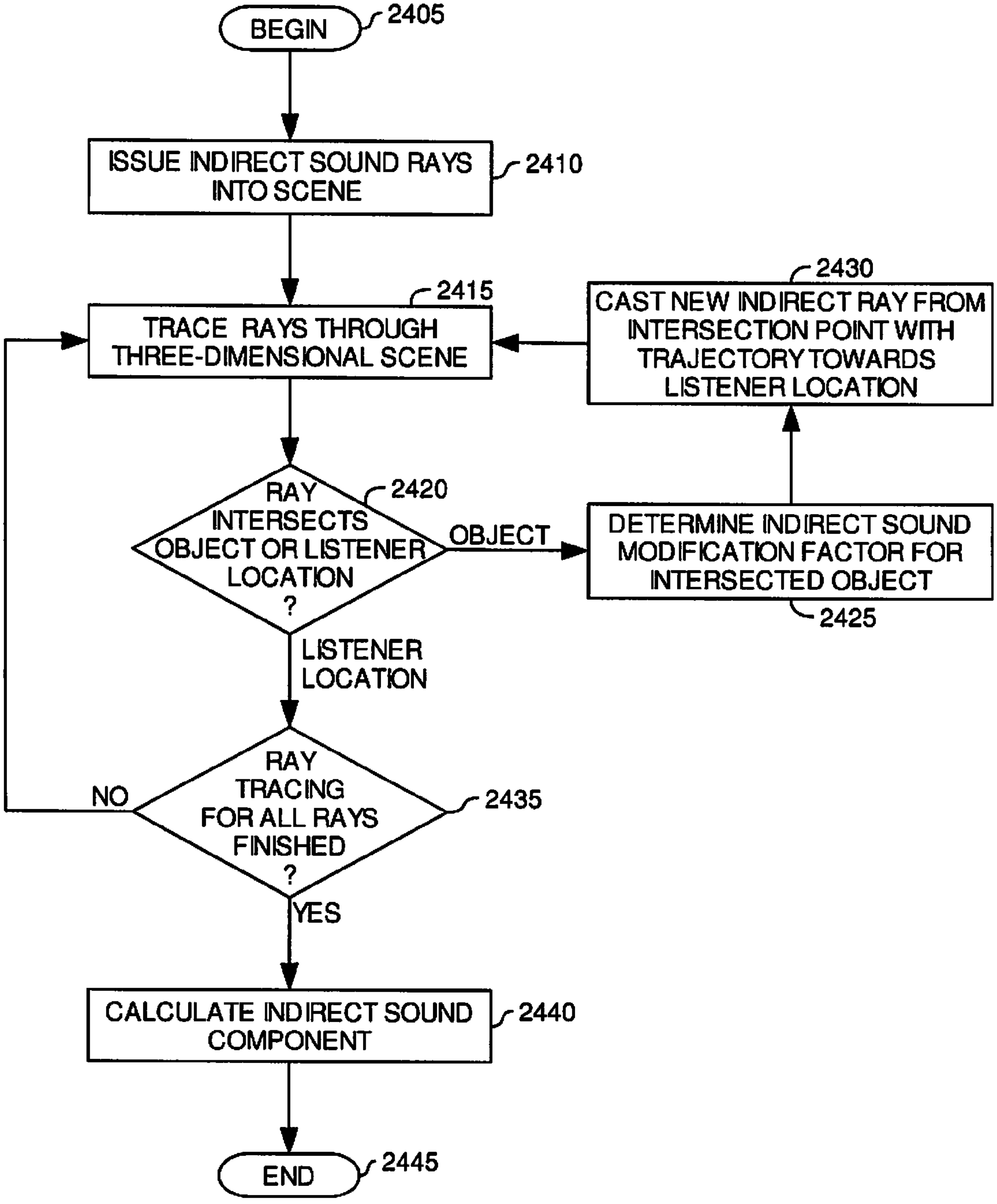
FIG. 24 is a flowchart which illustrates an exemplary method of issuing indirect sound rays into a three-dimensional scene and performing ray tracing with the indirect sound rays, according to one embodiment of the invention.

Returning to method 1800, after issuing the direct sound ray or rays into the three-dimensional scene and determining the sound component due to the direct sound rays, the sound engine may proceed to step 1820 to issue indirect sound rays into the three-dimensional scene and perform ray tracing with the indirect sound rays to determine an indirect sound component. FIG. 24 is a flowchart which illustrates an exemplary method 2400 of issuing indirect sound rays into the three-dimensional scene and performing ray tracing with the indirect sound rays to determine an indirect sound component, according to one embodiment of the invention.

The method 2400 begins at step 2405, for example, when step 1820 of method 1800 is executed by the sound engine. Next, at step 2410, the sound engine may issue indirect sound rays into the three-dimensional scene. The sound engine may issue the indirect sound rays into the scene such that they originate from the location of the sound event and have various trajectories directed away form the location of the sound event.

After issuing the indirect sound rays into the three-dimensional scene, at step 2415, the sound engine may perform ray tracing with the indirect sound rays. The sound engine may perform ray tracing with the indirect sound rays similar to how an image processing system may perform ray tracing as described above with respect to FIG. 4. That is, the sound engine may use a spatial index to trace the sound rays through the three-dimensional scene. The spatial index may contain nodes corresponding to bounding volumes which partition the three-dimensional scene. The sound engine may take branches to nodes in the spatial index which correspond to bounding volumes intersected by the sound rays. The sound engine may take branches to nodes until a leaf node containing primitives is reached, or in the case of a combined spatial index, until an object node is reached. Once an object node or leaf node is reached, the sound engine may perform ray-primitive or ray-object intersection tests to determine if a sound ray intersects a primitive or an object within the three-dimensional scene.

As an indirect sound ray is being traced through the spatial index, at step 2420 the sound engine may determine if the indirect sound ray intersects an object or intersects the listener location. If an indirect sound ray intersects an object within the three-dimensional scene, the sound engine may proceed to step 2425 to determine an indirect sound ray modification factor for the intersected object. The indirect sound ray modification factor for the intersection object may be a predetermined value based on properties of the object which defines an amount of sound which may be reflected by the intersected object. For example, if the object is a dense and smooth material (e.g., piece of metal, brick wall, etc.) the object may have an indirect sound modification factor which may reflect a relatively large amount of sound (e.g., reflected sound of equal or similar volume to the sound event). In contrast, if the object is a porous or soft material (e.g., acoustic dampening material, etc.) the object may have an indirect sound ray modification factor which will reflect a relatively small amount of sound (e.g., reflected sound with diminished volume compared to the sound event). In addition to modifying the amplitude or volume of a sound, the indirect sound modification factor associated with an object may also modify the pitch or frequency of the sound.

The indirect sound ray modification factor may be stored along with other attributes of an object. According to embodiments of the invention, the indirect sound modification factor or factors may be stored along with other information which defines the primitive. This information may be stored, for example, within the spatial index (e.g., integrated acceleration data structure).

According to one embodiment of the invention, after determining an indirect sound ray modification factor for the indirect sound ray and the intersected object, the sound engine may proceed to step 2430 where the sound engine may cast a new indirect sound ray into the three-dimensional scene due to the intersection of the indirect sound ray and the object. According to one embodiment of the invention, the new indirect sound ray may originate from the point the indirect sound ray intersected the object. Furthermore, the new indirect sound ray may have a trajectory directed towards the listener location. By casting a new indirect sound ray into the three-dimensional scene with a trajectory directed towards the listener location, the sound engine may quickly determine if a sound wave (emulated by the indirect sound ray) reaches the listener. After issuing the new indirect sound ray into the three-dimensional scene, the sound engine may return to step 2415 to perform ray tracing with the new sound ray.

Figure 25:
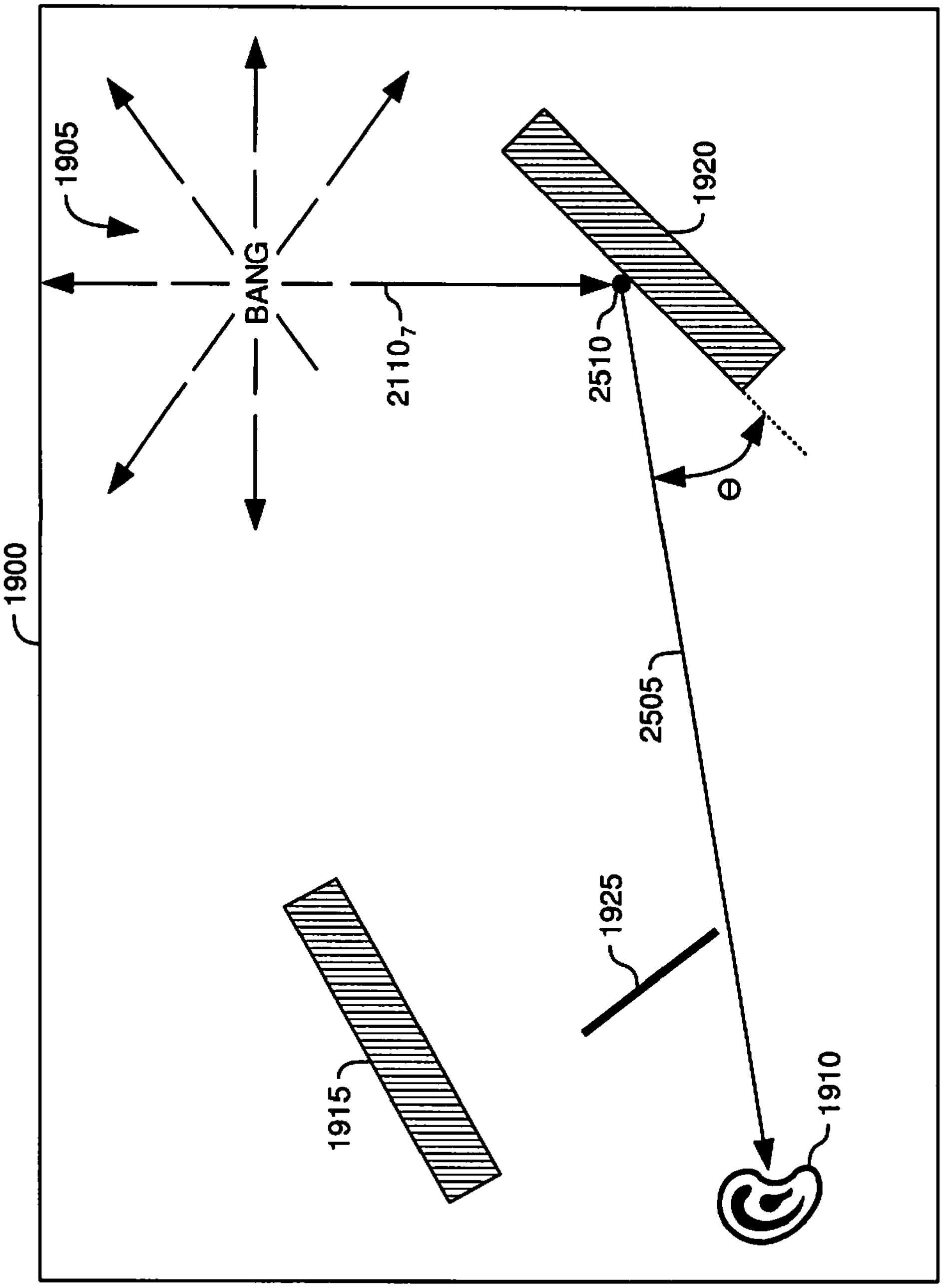

FIG. 25 illustrates the exemplary three-dimensional scene 1900 described above with respect to FIG. 19. However, FIG. 25 also illustrates the indirect sound ray $\mathbf{2110}_7$ intersecting the second wall object 1920. According to embodiments of the invention, the sound engine may determine the indirect sound ray $\mathbf{2110}_7$ intersects the second wall object 1920 in step 2420, and may proceed to step 2425 to determine an indirect sound modification factor for the intersected object. The sound engine may determine the indirect sound modification factor, for example, by searching a memory location within the memory space where the spatial index associated with the object (e.g., within the memory cache 110). After determining the indirect sound modification factor for the second wall object 1920 at step 2425, the sound engine may cast a new indirect sound ray into the three-dimensional scene 1900 in step 2430. The new indirect sound ray 2505 originates from a point 2510 where the indirect ray $\mathbf{2110}_7$ intersects the second wall object 1920 and may have a trajectory directed towards the listener 1910 location. The sound engine may perform ray tracing with the new indirect sound ray 2505, and may determine that the new indirect sound ray 2305 intersects the listener 1910 location.

According to one embodiment of the invention, after the sound engine determines that the indirect sound ray intersects the listener location, the sound engine may proceed to step 2435 to determine if ray tracing has completed for all of the indirect rays which were issued into the three-dimensional scene (indirect sound rays and new indirect sound rays). If ray tracing has not completed for all of the indirect sound rays, the sound engine may return to step 2415 to continue tracing the indirect sound rays through the three-dimensional scene.

However, if all indirect sound rays have been traced through the three-dimensional scene, the sound engine may proceed to step 2440 to calculate an indirect sound component. The calculation of the indirect sound component, for example, may take into consideration the objects intersected by the various indirect rays and sound modification factors associated with the intersected objects. Furthermore, the indirect sound component may also take into consideration the distance traveled by each indirect sound ray and any new indirect sound rays. After calculating the indirect sound component, the sound engine may proceed to step 2445 to end the method 2400.

For example, a portion of the indirect sound component due to the indirect ray $\mathbf{2110}_7$ may be the sound event or the prerecorded sound modified by the indirect sound modification factor of the second wall object 1920 and the total distance traveled by both the indirect sound ray $\mathbf{2110}_7$ and the new indirect sound ray 2505 (e.g., a delay due to the distance traveled by the rays). Furthermore, when modifying the sound event to determine an indirect sound ray contribution to the indirect sound component, the sound engine may also take into consideration an angle between the intersected object and the new indirect sound ray, and/or an angle between the intersected object and the indirect sound ray. For example, the angle between the intersected second wall object 1920 and the new indirect sound ray 2505 (e.g., illustrated as θ in FIG. 25), and/or an angle between the indirect sound ray $\mathbf{2110}_7$ and the intersected second wall object 1920.

According to other embodiments of the invention, the sound engine may end the method 2400 before the sound engine is finished performing ray tracing with all indirect sound rays. That is, in some embodiments of the invention, the sound engine may trace a sufficient number of indirect sound rays through the three-dimensional scene to determine a final sound, and tracing any more indirect sound rays through the three-dimensional scene may make an insignificant or unnoticeable difference to the final sound. Thus, according to some embodiments of the invention, the sound engine may end the method 2400 after some indirect sound rays have been traced through the three-dimensional scene but before all indirect sound rays have been traced through the three-dimensional scene.

Returning to FIG. 18, after ending method 2400, the sound engine may resume the execution of method 1800 at step 1825 where the sound engine may combine the direct sound component and the indirect sound component to create the final sound which is to be heard at the listener location. Then, at step 1830 the sound engine may play the modified sound.

Although embodiments of the invention are described as casting a single new sound ray from the point of intersection of a sound ray (direct or indirect) and an object, further embodiments of the invention may cast a plurality of new sound rays from the point of intersection of a sound ray and an object. The rays in the plurality of rays may have various trajectories including, but not limited to, a trajectory from the intersection point of the previous sound ray and the object directed towards the listener location. According to embodiments of the invention, after determining an intersection of a sound ray and an object, the sound engine may issue a plurality of rays including, but not limited to, a reflected sound ray and a transmitted sound ray into the three-dimensional scene from the point of intersection of a sound ray and an object. Furthermore, each object (or primitive) within the scene may have a reflective property value and a transmissive property value which may be stored with other properties which define the object (or primitive). The reflective property value may indicate the amount of sound reflected by the object and the amount of sound which may be transmitted through the object, respectively. The rays may be traced through the three-dimensional scene similar to how the sound engine traced the direct and indirect rays through the three-dimensional scene.

Figure 26:
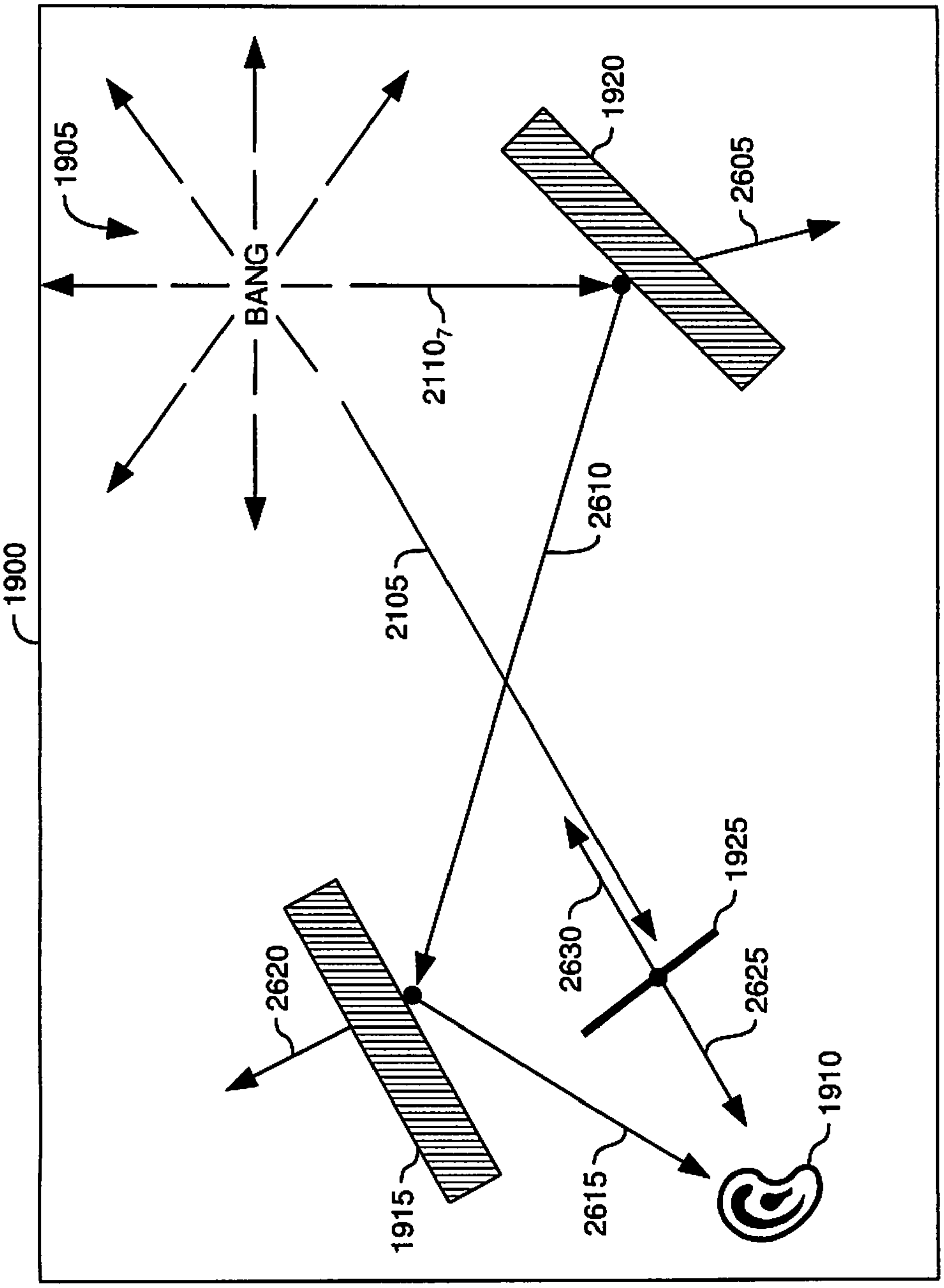

For example, as illustrated in FIG. 26, the indirect sound ray $\mathbf{2110}_7$ may intersect the second wall object 1920. In response to detecting the intersection, the sound engine may issue a transmitted sound ray 2605 and a reflected sound ray 2610 into the three-dimensional scene from the point of intersection. After performing ray tracing with the transmitted ray and the reflected sound ray, the sound engine may determine that the reflected sound ray 2610 intersects the first wall object 1915, and in response to the intersection the sound engine may issue a second reflected sound ray 2615 and a second transmitted sound ray 2620 into the three-dimensional scene. After performing ray tracing with the second reflected sound ray, the sound engine may determine that the second reflected sound ray intersects the listener location and may determine an indirect sound component based on the second reflected sound ray. In contrast, the sound engine may determine that neither of the first transmitted sound ray 2605 nor the second transmitted sound ray 2620 intersected the listener location and, therefore, do not contribute to the indirect sound component.

Furthermore, as illustrated in FIG. 26, the sound engine may determine that the direct sound ray 2105 intersects the window object 1925. In response to the intersection, the sound engine may issue a transmitted sound ray 2625 and a reflected sound ray 2630 into the three-dimensional scene. The sound engine may perform ray tracing with the reflected sound ray 2630 and the transmitted sound ray 2625, and may determine from the results of ray tracing these sound rays through the three-dimensional scene 1900 that the transmitted sound ray 2625 intersects the listener 1910 location, but the reflected sound ray 2630 does not. Thus, the sound engine may use the transmitted sound ray 2625 when determining the direct sound component portion of the final sound heard at the listener location.

By issuing a plurality of rays into the three-dimensional scene after an intersection of a sound ray and an object, the sound engine may more accurately emulate how sound waves may reflect off of objects with a three-dimensional scene and, thus, generate a more realistic sound.

Furthermore, according to embodiments of the invention, the number of direct sound rays and indirect sound rays issued into the three-dimensional scene may be determined by the amount of processing bandwidth available to the sound engine for sound processing. Thus, if more processing bandwidth is available, more sound rays may be issued into the three-dimensional scene which may result in a more realistic final sound at the listener location.

CONCLUSION

According to embodiments of the invention, a sound engine may determine a final sound at a listener location by emulating sound waves within a three-dimensional scene. The sound engine may emulate sound waves by issuing rays from a location of a sound event and tracing the rays through the three-dimensional scene. The rays may intersect objects within the three-dimensional scene which have sound modification factors. The sound modification factors and other factors (e.g., distance traveled by the ray, angle of intersection with the object, etc.) may be applied to the sound event to determine a final sound which is heard by the listener.

While the foregoing is directed to embodiments of the present invention, other and further embodiments of the invention may be devised without departing from the basic scope thereof, and the scope thereof is determined by the claims that follow.

What is claimed is:

1. A method of simulating sound in a three-dimensional scene, comprising:

generating a sound event at a first location in the three-dimensional scene;

issuing at least two rays into the three-dimensional scene originating from the first location, the at least two rays emulating a sound wave generated by the sound event, wherein a direct ray of the at least two rays has a trajectory directed towards a second location within the three-dimensional scene and wherein an indirect ray of the at least two rays has a trajectory different than the trajectory of the direct ray;

performing ray tracing with the at least two rays using a spatial index having branches and nodes corresponding to bounding volumes which partition the three-dimensional scene;

based on the results of ray tracing the at least two rays through the three-dimensional scene, determining a resulting sound at the second location; and generating an output signal used to generate the resulting sound.

2. The method of claim 1, wherein performing ray tracing comprises taking branches to nodes corresponding to bounding volumes intersected by the at least two rays.

3. The method of claim 2, further comprising:

determining that the direct intersects a primitive within the three-dimensional scene; and determining a sound modification factor associated with the intersected primitive.

4. The method of claim 3, wherein determining the resulting sound comprises modifying a prerecorded sound based at least in part on the sound modification factor.

5. The method of claim 1, further comprising:

determining that the indirect ray intersects a primitive within the three-dimensional scene;

determining a sound modification factor associated with the primitive, wherein determining the resulting sound comprises modifying a prerecorded sound based at least in part on the sound modification factor.

6. The method of claim 1, wherein the indirect ray intersects a primitive in the three-dimensional scene further comprising:

issuing a new indirect ray that is reflected from the surface of the primitive with a trajectory towards the second location.

7. The method of claim 1, wherein the direct ray intersects a primitive in the three-dimensional scene further comprising:

issuing a new direct ray at a point different from the point of intersection with the primitive, wherein the new direct ray has a trajectory towards the second location.

8. A non-transitory computer readable medium containing a program which, when executed, performs operations comprising:

generating a sound event at a first location in a three-dimensional scene;

issuing at least two rays into the three-dimensional scene originating from the first location, the at least two rays emulating a sound wave generated by the sound event, wherein a direct ray of the at least two rays has a trajectory directed towards a second location within the three-dimensional scene and wherein an indirect ray of the at least two rays has a trajectory different than the trajectory of the direct ray;

performing ray tracing with the at least two rays using a spatial index having branches and nodes corresponding to bounding volumes which partition the three-dimensional scene; and based on the results of ray tracing the at least two rays through the three-dimensional scene, determining a resulting sound at the second location.

9. The non-transitory computer readable medium of claim 8, wherein performing ray tracing comprises taking branches to nodes corresponding to bounding volumes intersected by the at least two rays.

10. The non-transitory computer readable medium of claim 9, wherein the operations further comprise:

determining that the direct ray intersects a primitive within the three-dimensional scene;

determining a sound modification factor associated with the intersected primitive; and wherein determining the resulting sound comprises modifying a prerecorded sound based at least in part on the sound modification factor.

11. The non-transitory computer readable medium of claim 8, wherein the operations further comprise:

determining that the indirect ray intersects a primitive within the three-dimensional scene;

determining a sound modification factor associated with the primitive wherein determining the resulting sound comprises, modifying a prerecorded sound based at least in part on the sound modification factor.

12. The method of claim 8, wherein the indirect ray intersects a primitive in the three-dimensional scene further comprising:

issuing a new indirect ray that is reflected from the surface of the primitive with a trajectory towards the second location.

13. The method of claim 8, wherein the direct ray intersects a primitive in the three-dimensional scene further comprising:

issuing a new direct ray at a point different from the point of intersection with the primitive, wherein the new direct ray has a trajectory towards the second location.

14. A system, comprising:

a memory device containing a spatial index having nodes which correspond to bounding volumes which partition a three-dimensional scene; and a processing element configured to:

issue at least one two rays into the three-dimensional scene originating from a first location corresponding to a sound event, the at least two rays emulating a sound wave generated by the sound event, wherein a direct ray of the at least two rays has a trajectory directed towards a second location within the three-dimensional scene and wherein an indirect ray of the at least two rays has a trajectory different than the trajectory of the direct ray, perform ray tracing with the at least two rays using a spatial index having branches and nodes corresponding to bounding volumes which partition the three-dimensional scene, and based on the results of ray tracing the at least two rays through the three-dimensional scene, determine a resulting sound at the second location.

15. The system of claim 14, wherein the processing element is configured to perform ray tracing by:

taking branches to nodes of the spatial index corresponding to bounding volumes intersected by the at least two rays.

16. The system of claim 15, wherein the processing element is further configured to:

determine that the direct ray intersects a primitive within the three-dimensional scene; and determine a sound modification factor associated with the intersected primitive.

17. The system of claim 16, wherein the processing element is configured to determine the resulting sound by modifying a prerecorded sound based at least in part on the sound modification factor.

18. The system of claim 14, wherein the processing element is further configured to:

determine that the indirect ray intersects a primitive within the three-dimensional scene;

determine a sound modification factor associated with the primitive, wherein determining the resulting sound comprises, modifying a prerecorded sound based at least in part on the sound modification factor.

19. The method of claim 14, wherein the indirect ray intersects a primitive in the three-dimensional scene further comprising:

issuing a new indirect ray that is reflected from the surface of the primitive with a trajectory towards the second location.

20. The method of claim 14, wherein the direct ray intersects a primitive in the three-dimensional scene further comprising:

issuing a new direct ray at a point different from the point of intersection with the primitive, wherein the new direct ray has a trajectory towards the second location.

* * * * *